(12) United States Patent
Fujikane

(10) Patent No.: US 10,526,727 B2
(45) Date of Patent: Jan. 7, 2020

(54) DEVICE INCLUDING SEMICONDUCTOR SUBSTRATE CONTAINING GALLIUM NITRIDE AND METHOD FOR PRODUCING THE SAME

(71) Applicant: PANASONIC INTELLECTUAL PROPERTY MANAGEMENT CO., LTD., Osaka (JP)

(72) Inventor: Masaki Fujikane, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 0 days.

(21) Appl. No.: 16/433,505

(22) Filed: Jun. 6, 2019

(65) Prior Publication Data

US 2019/0284719 A1   Sep. 19, 2019

Related U.S. Application Data

(63) Continuation of application No. 15/589,016, filed on May 8, 2017, now Pat. No. 10,378,124.

(30) Foreign Application Priority Data

May 18, 2016 (JP) .................................. 2016-100006
Aug. 24, 2016 (JP) .................................. 2016-164176

(51) Int. Cl.
*C30B 29/40* (2006.01)
*C30B 33/00* (2006.01)
(Continued)

(52) U.S. Cl.
CPC .......... *C30B 29/406* (2013.01); *B01D 53/261* (2013.01); *C30B 33/005* (2013.01);
(Continued)

(58) Field of Classification Search
CPC .......... H01L 21/0254; H01L 21/02389; H01L 21/0243; H01L 21/02664; C30B 29/406; C30B 33/12; C30B 33/04

See application file for complete search history.

(56) References Cited

U.S. PATENT DOCUMENTS 7,829,207 B2 * 11/2010 Kato ........................ C30B 23/02
117/944
9,412,580 B2 * 8/2016 Arena ..................... C30B 25/02
(Continued)

FOREIGN PATENT DOCUMENTS

EP   2246462 A1   11/2010
EP   2302113 A1   3/2011
(Continued)

OTHER PUBLICATIONS

The Extended European Search Report dated Mar. 27, 2019 for the related European Patent Application No. 19153279.5.
(Continued)

*Primary Examiner* — Thanh Y. Tran
(74) *Attorney, Agent, or Firm* — McDermott Will & Emery LLP

(57) ABSTRACT

A device includes a semiconductor substrate containing gallium nitride and having a crystal face inclined from 0.05° to 15° inclusive with respect to the c-plane. The semiconductor substrate includes an irregular portion on the crystal face, and the contact angle of pure water having a specific resistance of 18 MΩ·cm or more on the surface of the irregular portion is 10° or less.

8 Claims, 30 Drawing Sheets

(51) Int. Cl.
*C30B 33/12* (2006.01)
*B01D 53/26* (2006.01)
*C30B 33/04* (2006.01)
*C30B 33/08* (2006.01)
*E03B 3/28* (2006.01)
*H01L 21/02* (2006.01)

(52) U.S. Cl.
CPC .............. *C30B 33/04* (2013.01); *C30B 33/08* (2013.01); *C30B 33/12* (2013.01); *E03B 3/28* (2013.01); *H01L 21/0243* (2013.01); *H01L 21/0254* (2013.01); *H01L 21/02389* (2013.01); *H01L 21/02664* (2013.01)

(56) References Cited

U.S. PATENT DOCUMENTS

| | | |
|---|---|---|
| 2003/0186088 A1 | 10/2003 | Kato et al. |
| 2012/0138985 A1 | 6/2012 | Ono et al. |
| 2012/0267606 A1 | 10/2012 | Ishibashi et al. |
| 2013/0248877 A1 | 9/2013 | Fujikane et al. |
| 2014/0034961 A1 | 2/2014 | Fujikane et al. |
| 2018/0112332 A1 | 4/2018 | Okumura et al. |
| 2019/0129299 A1* | 5/2019 | Nasalevich ............... G03F 1/62 |

FOREIGN PATENT DOCUMENTS

| | | |
|---|---|---|
| JP | 2004-232998 A | 8/2004 |
| JP | 2008-142818 A | 6/2008 |
| WO | 2012/176369 A1 | 12/2012 |
| WO | 2013/014713 A1 | 1/2013 |

OTHER PUBLICATIONS

The partial European search report (R.64 EPC) dated Oct. 9, 2017 for the related European Patent Application No. 17167854.3.
The Extended European Search Report dated Nov. 28, 2017 for the related European Patent Application No. 17167854.3.
Non-Final Office Action issued in U.S. Appl. No. 15/589,016, dated Jun. 29, 2018.
Final Office Action issued in U.S. Appl. No. 15/589,016, dated Jan. 7, 2019.
Notice of Allowance issued in U.S. Appl. No. 15/589,016, dated Apr. 29, 2019.

* cited by examiner c-AXIS

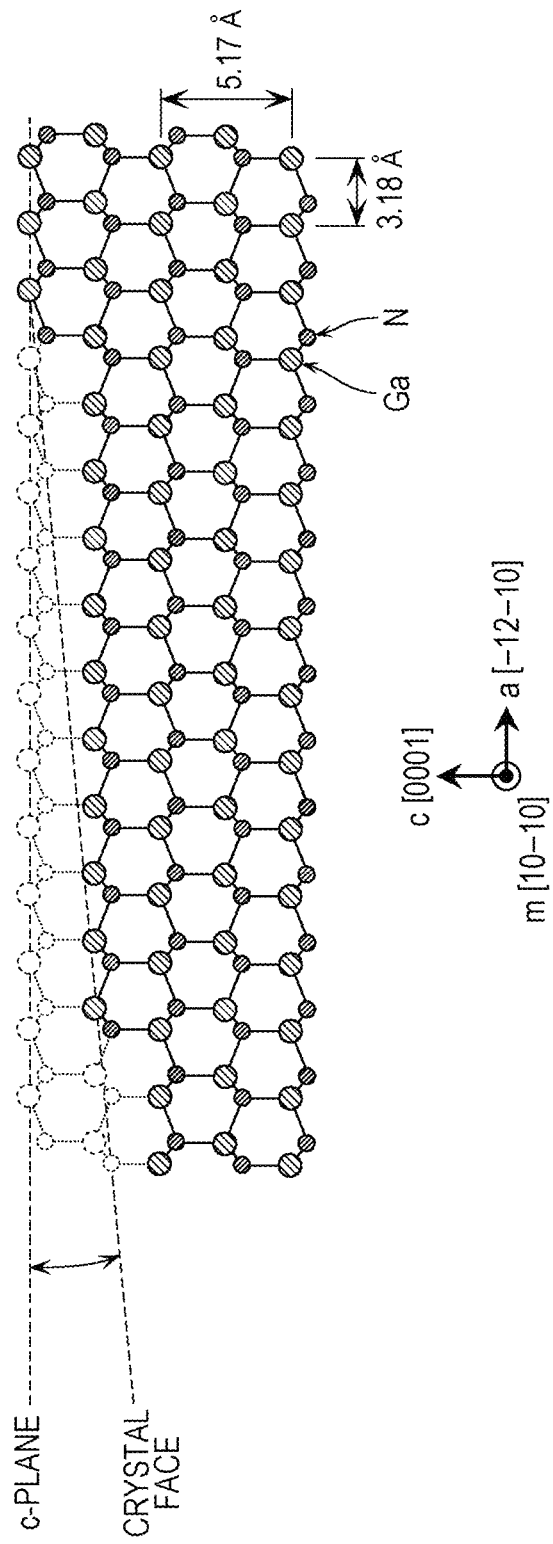

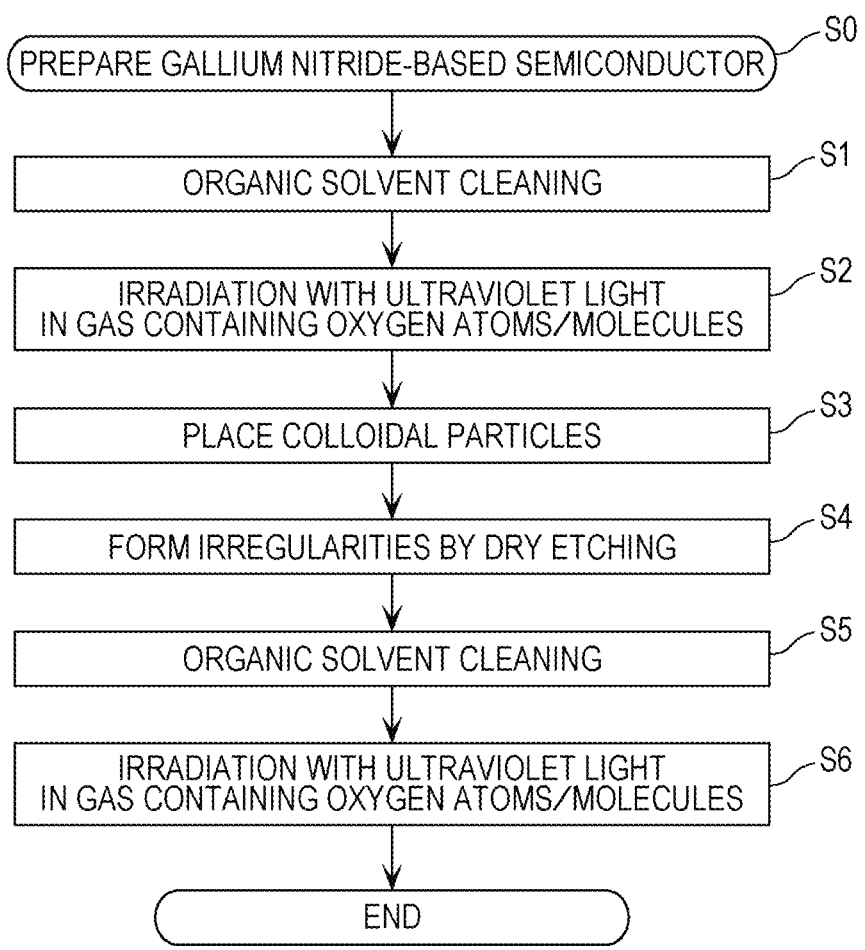

DEVICE INCLUDING SEMICONDUCTOR SUBSTRATE CONTAINING GALLIUM NITRIDE AND METHOD FOR PRODUCING THE SAME

CROSS-REFERENCE OF RELATED APPLICATIONS

This application is a Continuation of U.S. patent application Ser. No. 15/589,016, filed on May 8, 2017, which claims the benefit of Japanese Application No. 2016-164176, filed on Aug. 24, 2016 and Japanese Application No. 2016-100006, filed on May 18, 2016, the entire disclosures of which Applications are incorporated by reference herein.

BACKGROUND

Technical Field

The present disclosure relates to a device including a semiconductor substrate containing gallium nitride and to a method for producing the device.

Description of the Related Art

At present, it is said that adequate environmental sanitation is not ensured for about 2.6 billion people out of the world population of about 7 billion. In regions poor in water resources, there is a need for techniques for obtaining clean water such as desalination of seawater, removal of impurities from groundwater, and purification of rainwater.

As one example of such a technique, Japanese Unexamined Patent Application Publication No. 2004-232998 discloses a water collecting device in which an adsorbent such as silica gel is used to collect water molecules.

SUMMARY

In one general aspect, the techniques disclosed here feature a device including a semiconductor substrate that contains gallium nitride and has a crystal face inclined from 0.05° to 15° inclusive with respect to a c-plane. The semiconductor substrate includes an irregular portion on the crystal face, and the contact angle of pure water having a specific resistance of 18 MΩ·cm or more on a surface of the irregular portion is 10° or less.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 3E is a schematic illustration for showing a crystal face inclined from 0.05° to 15° inclusive with respect to the c-plane;

FIG. 4C is a flowchart showing an example of a method for producing the device in embodiment 1;

DETAILED DESCRIPTION

The water collecting device described in Japanese Unexamined Patent Application Publication No. 2004-232998 requires a large-scale device in order to take the water molecules collected by the absorbent to the outside.

A device according to a first aspect of the present disclosure can easily collect water vapor to obtain water.

The device according to the first aspect of the present disclosure can be used as, for example, a device that uses water vapor in gas form as a water source, collects the water vapor, and coverts it to water in liquid form. To collect water vapor in air, the device according to the first aspect of the present disclosure uses a gallium nitride-containing semiconductor substrate that is a GaN-based semiconductor (gallium nitride-based semiconductor).

The crystal structure of the GaN-based semiconductor will be described with reference to FIGS. 1 to 3E.

Figure 1:
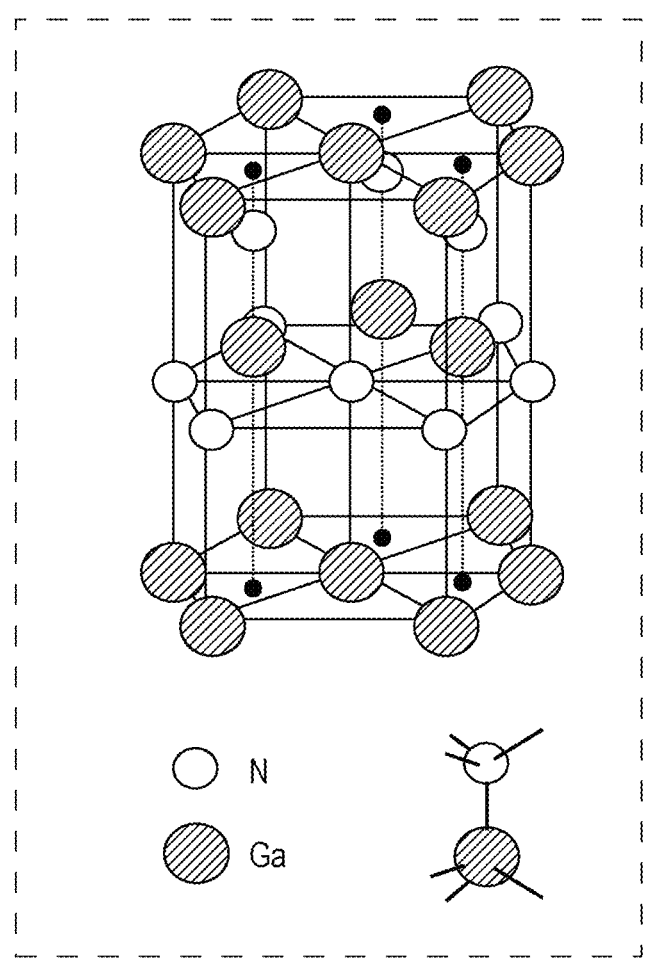
FIG. 1 is a perspective view schematically illustrating the unit cell of GaN.

FIG. 1 is an illustration schematically showing the unit cell of GaN.

The GaN-based semiconductor has a wurtzite crystal structure. In an $Al_xGa_yIn_zN$ ($0 \leq x, y, z \leq 1$, $x+y+z=1$) semiconductor crystal, part of Ga shown in FIG. 1 may be substituted by Al and/or In.

Figure 2:
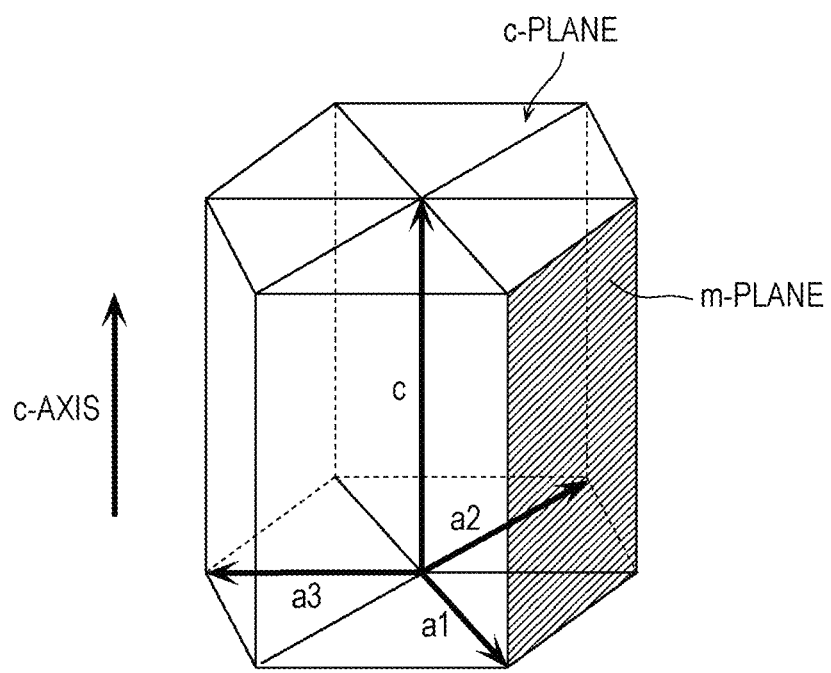
FIG. 2 is a perspective view showing primitive translation vectors a1, a2, a3, and c of a wurtzite crystal structure.
Figure 3A:
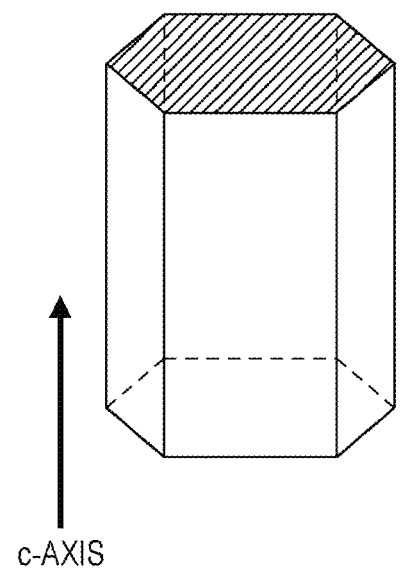
FIG. 3A is a schematic illustration showing a representative crystal plane orientation of the hexagonal wurtzite structure.
Figure 3B:
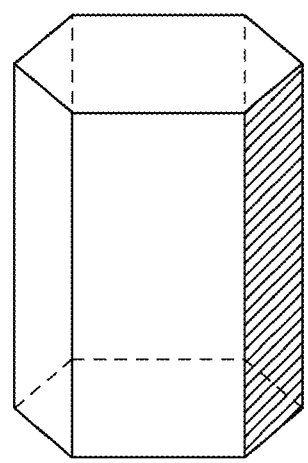
FIG. 3B is a schematic illustration showing a representative crystal plane orientation of the hexagonal wurtzite structure.
Figure 3C:
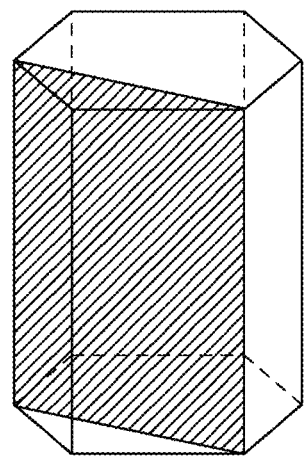
FIG. 3C is a schematic illustration showing a representative crystal plane orientation of the hexagonal wurtzite structure.
Figure 3D:
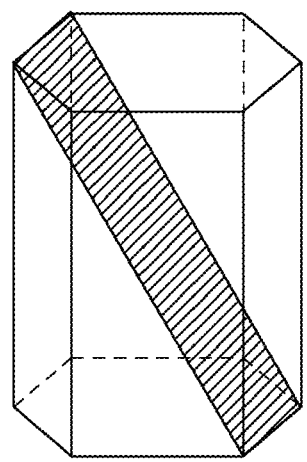
FIG. 3D is a schematic illustration showing a representative crystal plane orientation of the hexagonal wurtzite structure.

FIG. 2 is an illustration showing the primitive translation vectors a1, a2, a3, and c of the wurtzite crystal structure. FIGS. 3A to 3D are schematic illustrations showing representative crystal plane orientations of the hexagonal wurtzite structure. FIG. 3A shows a c-plane, and FIG. 3B shows an m-plane. FIG. 3C shows an a-plane, and FIG. 3D shows an r-plane. FIG. 3E is a schematic illustration for showing a crystal face inclined from 0.05° to 15° inclusive with respect to the c-plane.

The primitive translation vector c extends in the [0001] direction, and this direction is referred to as a "c-axis." A plane perpendicular to the c-axis is referred to as the "c-plane" or "(0001) plane." A plane terminated by a group III element such as Ga is referred to as a "+c-plane" or "(0001) plane," and a plane terminated by a group V element such as nitrogen is referred to as a "−c-plane" or a "(000-1) plane." These planes are distinguished from each other.

The "m-plane" shown in FIG. 2 means the (10-10) plane perpendicular to the [10-10] direction. The m-plane is parallel to the c-axis and orthogonal to the c-plane. The "a-plane" shown in FIG. 3C means the (11-20) plane perpendicular to the [11-20] direction. The a-plane is parallel to the c-axis and orthogonal to the c-plane. The "r-plane" shown in FIG. 3D means the (10-12) plane perpendicular to the [10-12] direction. FIG. 3D shows the (−1012) plane which is an example of the r-plane.

The device according to the first aspect of the present disclosure includes a semiconductor substrate containing gallium nitride and having a crystal face inclined from 0.05° to 15° inclusive with respect to the c-plane. The semiconductor substrate includes an irregular portion on the crystal face, and the contact angle of pure water having a specific resistance of 18 MΩ·cm or more on the surface of the irregular portion is 10° or less. FIG. 3E shows an example in which the crystal face is inclined about 4.6° with respect to the c-plane. The specific resistance of pure water can be measured using a specific resistance meter. In the device according to the first aspect of the present disclosure, the total organic carbon (TOC) value of the pure water may be 5 ppb or less. The TOC value of the pure water can be measured using, for example, a total organic carbon meter.

In this device, the surface of the irregular portion of the crystal face is hydrophilic, so that water vapor tends to gather in the irregular portion. Therefore, by allowing water vapor in air to adhere to the irregular portion, the water vapor can be collected. Since the crystal face has the irregular portion, the crystal face has an increased surface area. This allows a large amount of water vapor to be collected on the crystal face. The collected water vapor forms water droplets on the crystal face. As described above, water vapor can be easily collected to thereby obtain water. The device according to the first aspect of the present disclosure may be used for an application in which hydrogen is generated from water.

In the device according to the first aspect of the present disclosure, the mean width of roughness profile elements (RSm) of the crystal face may be from 0.8 μm to 1,000 μm inclusive.

In this case, the crystal face of the gallium nitride-based semiconductor has an increased surface area, and a larger amount of water vapor can be collected.

In the device according to the first aspect of the present disclosure, the crystal face may have an arithmetic mean roughness (Ra) of from 10 nm to 800 nm inclusive.

In this case, the crystal face of the gallium nitride-based semiconductor has an increased surface area, and a larger amount of water vapor can be collected.

In the device according to the first aspect of the present disclosure, the surface of the irregular portion may be superhydrophilic.

When the surface of the irregular portion is superhydrophilic, a larger amount of water vapor can adhere to the irregular portion and be collected.

In the device according to the first aspect of the present disclosure, the crystal face may be inclined 0.4° with respect to the c-plane.

In this case, steps at edges of terraces formed on the crystal face and composed of atoms contained in GaN in the c-plane are chemically activated, and a more stable structure (e.g., gallium oxide) is likely to be formed. Therefore, the crystal face formed is likely to be superhydrophilic.

In the device according to the first aspect of the present disclosure, the semiconductor substrate may be a GaN substrate.

In this case, steps at edges of terraces formed on the crystal face and composed of atoms contained in GaN in the c-plane are chemically activated, and a more stable structure (e.g., gallium oxide) is likely to be formed. Therefore, the crystal face formed is likely to be superhydrophilic.

In the device according to the first aspect of the present disclosure, water vapor may be collected on the crystal face and form water droplets.

In this case, this device can be used to convert water vapor to water.

A device production method according to a second aspect of the present disclosure includes: preparing a semiconductor substrate containing gallium nitride and having a crystal face inclined with respect to a c-plane; forming an irregular portion on the crystal face by subjecting at least part of the crystal face to dry etching; and modifying a surface of the irregular portion.

With the above method, the irregular portion of the crystal face of the gallium nitride-based semiconductor can be formed efficiently.

In the device production method according to the second aspect of the present disclosure, the modifying the surface of the irregular portion may include irradiating the at least part of the crystal face with ultraviolet light with the at least part of the crystal face exposed to a gas containing oxygen atoms or oxygen molecules, or a liquid containing oxygen atoms or oxygen molecules.

In this case, the surface of the irregular portion of the crystal face can be efficiently modified for the purpose of collecting water vapor.

In the device production method according to the second aspect of the present disclosure, the modifying the surface of the irregular portion may further include, before the irradiating the at least part of the crystal face with the ultraviolet light, cleaning the at least part of the crystal face with an organic solvent.

In this case, the surface of the irregular portion of the crystal face can be modified uniformly.

The device production method according to the second aspect of the present disclosure may further include, before the forming the irregular portion, modifying the crystal face and placing a plurality of particles on the modified crystal face.

In this case, the irregular portion can have a random shape, and the conversion of water vapor to water droplets can be facilitated.

In the device production method according to the second aspect of the present disclosure, the modifying the crystal face may include irradiating the crystal face with ultraviolet light with the crystal face exposed to a gas containing oxygen atoms or oxygen molecules, or a liquid containing oxygen atoms or oxygen molecules.

In this case, the crystal face can be superhydrophilic.

In the device production method according to the second aspect of the present disclosure, the modifying the crystal face may further include, before the irradiating the crystal face with the ultraviolet light, cleaning the crystal face with an organic solvent.

In this case, the crystal face can be uniformly superhydrophilic.

In the device production method according to the second aspect of the present disclosure, the crystal face may be inclined from 0.05° to 15° inclusive with respect to the c-plane.

In this case, steps at edges of terraces formed on the crystal face and composed of atoms contained in GaN in the c-plane are chemically activated, and a more stable structure (e.g., gallium oxide) is likely to be formed. Therefore, the crystal face formed is likely to be superhydrophilic.

A water vapor collecting method according to the present disclosure includes: preparing a semiconductor substrate containing gallium nitride, having a crystal face inclined with respect to a c-plane, and having an irregular portion provided on the crystal face, the irregular portion having a superhydrophilic surface; and exposing the crystal face of the semiconductor substrate to air to thereby collect water vapor in the air.

As described above, since the surface of the irregular portion of the crystal face is superhydrophilic, water vapor tends to gather in the irregular portion, and the water vapor adhering to the irregular portion can be collected. Since the crystal face has the irregular portion, the crystal face has an increased surface area. Therefore, a large amount of water vapor can be collected on the crystal face.

In addition, water vapor can be collected without using an unnecessarily large amount of electric power or unnecessarily heating the device as in the conventional art. A device according to a third aspect of the present disclosure includes a semiconductor substrate containing gallium nitride and having a crystal face inclined with respect to a c-plane, wherein the semiconductor substrate has an irregular portion on the crystal face, wherein the contact angle of pure water having a specific resistance of 18 MΩ·cm or more on a surface of the irregular portion is 10° or less, and wherein the surface has a characteristic that, when a pure water droplet with a volume of 10 µL is dropped onto the surface and then the surface is inclined at least 15° with respect to a horizontal plane, the water droplet slides down the surface. In the device according to the third aspect of the present disclosure, the pure water may have a total organic carbon (TOC) value of 5 ppb or less. The present disclosure further encompasses devices and methods described in the following items.

[Item 1] A surface-modified semiconductor production method according to item 1 of the present disclosure includes:

preparing a semiconductor substrate containing gallium nitride and having a crystal face inclined from 0.05° to 15° inclusive with respect to a c-plane; and irradiating the crystal face with ultraviolet light with the crystal face exposed to a gas containing oxygen atoms or oxygen molecules or a liquid containing oxygen atoms or oxygen molecules to thereby impart superhydrophilicity to the crystal face.

[Item 2] The surface-modified semiconductor production method according to item 1 of the present disclosure may further include, before the irradiating the crystal face with the ultraviolet light, cleaning the semiconductor substrate with an organic solvent.

[Item 3] In the surface-modified semiconductor production method according to item 2 of the present disclosure, the organic solvent may contain at least one selected from the group consisting of acetone, methanol, ethanol, and isopropyl alcohol.

[Item 4] In the surface-modified semiconductor production method according to any of items 1 to 3 of the present disclosure, the crystal face may be inclined 0.4° with respect to the c-plane.

[Item 5] In the surface-modified semiconductor production method according to any of items 1 to 4 of the present disclosure, the semiconductor substrate may be a GaN substrate.

[Item 6] In the surface-modified semiconductor production method according to any of items 1 to 5 of the present disclosure, the ultraviolet light may be emitted from a mercury lamp.

[Item 7] A surface-modified semiconductor according to item 7 of the present disclosure includes:

a semiconductor substrate containing gallium nitride and having a crystal face inclined from 0.05° to 15° inclusive with respect to a c-plane; and a surface-modified layer disposed on the crystal face, wherein the contact angle of pure water having a specific resistance of 18 MΩ·cm or more on a surface of the surface-modified layer is 10° or less.

[Item 8] In the surface-modified semiconductor according to item 7 of the present disclosure, the crystal face may be inclined 0.4° with respect to the c-plane.

[Item 9] In the surface-modified semiconductor according to item 7 or 8 of the present disclosure, the semiconductor substrate may be a GaN substrate.

[Item 10] A method according to item 10 of the present disclosure includes:

preparing a surface-modified semiconductor including a semiconductor substrate that contains gallium nitride and has a crystal face inclined from 0.05° to 15° inclusive with respect to a c-plane and a surface-modified layer disposed on the crystal face, the contact angle of pure water with a specific resistance of 18 MΩ·cm or more on a surface of the surface-modified layer being 10° or less, immersing the surface-modified semiconductor in a hydrophilic solution containing a plurality of particles, and withdrawing the surface-modified semiconductor immersed in the solution from the solution to thereby dispose the plurality of particles on the surface of the surface-modified layer.

[Item 11] In the method according to item 10 of the present disclosure, the plurality of particles may be hydrophilic.

[Item 12] In the method according to item 11 of the present disclosure, the plurality of particles may have surfaces subjected to hydrophilic treatment.

[Item 13] In the method according to any of items 10 to 12 of the present disclosure, the plurality of particles may contain at least one selected from the group consisting of $SiO_2$, $TiO_2$, ZnO, Au, Ag, polystyrene, benzoguanamine-melamine-formaldehyde condensates, and polymethyl methacrylate-based cross-linked products.

[Item 14] In the method according to any of items 10 to 13 of the present disclosure, the solution may contain at least one selected from the group consisting of water, methanol, ethanol, phenol, ethylene glycol, and acetic acid.

[Item 15] A device according to item 15 of the present disclosure includes a semiconductor substrate containing gallium nitride and having a crystal face inclined from 0.05° to 15° inclusive with respect to a c-plane, wherein the semiconductor substrate has an irregular portion on the crystal face, wherein a mean width of roughness profile elements (RSm) of the irregular portion is from 0.8 µm to 1,000 µm inclusive, and wherein apex portions of at least some of convex sections of the irregular portion contain a material different from a material of the rest of the irregular portion.

[Item 16] In the device according to item 15 of the present disclosure, a surface of the irregular portion may have a random shape.

[Item 17] In the device according to item 15 or 16 of the present disclosure, the convex sections may be randomly disposed on the crystal face.

[Item 18] In the device according to any of items 15 to 17 of the present disclosure, the number density of the convex sections in the irregular portion may be from $1/\mu m^2$ to $120/\mu m^2$ inclusive.

[Item 19] In the device according to any of items 15 to 18 of the present disclosure, the irregular portion may have an arithmetic mean roughness (Ra) of from 10 nm to 800 nm inclusive.

[Item 20] In the device according to any of items 15 to 19 of the present disclosure, the crystal face may be inclined 0.4° with respect to the c-plane.

[Item 21] In the device according to any of items 15 to 20 of the present disclosure, the semiconductor substrate may be a GaN substrate.

[Item 22] In the device according to any of items 15 to 21 of the present disclosure, the material different from the material of the rest of the irregular portion may be at least one selected from the group consisting of $SiO_2$, $TiO_2$, ZnO, Au, Ag, polystyrene, benzoguanamine-melamine-formaldehyde condensates, and polymethyl methacrylate-based crosslinked products.

[Item 23] A device production method according to item 23 of the present disclosure includes:

preparing a semiconductor substrate containing gallium nitride and having a crystal face inclined from 0.05° to 15° inclusive with respect to a c-plane;

modifying the crystal face;

placing a plurality of particles on the modified crystal face; and subjecting the crystal face on which the plurality of particles are placed to dry etching to thereby form, on at least part of the crystal face, an irregular portion in which a mean width of roughness profile elements (RSm) is from 0.8 μm to 1,000 μm inclusive.

[Item 24] In the device production method according to item 23 of the present disclosure, the placing the plurality of particles may include immersing the modified crystal face in a solution containing the plurality of particles, and withdrawing the crystal face from the solution.

[Item 25] In the device production method according to item 24 of the present disclosure, the solution may be hydrophilic.

[Item 26] In the device production method according to item 24 or 25 of the present disclosure, the solution may contain at least one selected from the group consisting of water, methanol, ethanol, phenol, ethylene glycol, and acetic acid.

[Item 27] In the device production method according to any of items 23 to 26 of the present disclosure, the modifying the crystal face may include exposing the crystal face to an atmosphere containing oxygen atoms to thereby oxidize the crystal face.

[Item 28] In the device production method according to any of items 23 to 27 of the present disclosure, surfaces of the plurality of particles may be hydrophilic.

[Item 29] In the device production method according to any of items 23 to 28 of the present disclosure, the plurality of particles may contain at least one selected from the group consisting of $SiO_2$, $TiO_2$, ZnO, Au, Ag, polystyrene, benzoguanamine-melamine-formaldehyde condensates, and polymethyl methacrylate-based crosslinked products.

Embodiment 1

Embodiments will next be described in detail with appropriate reference to the drawings. However, unnecessarily detailed description may be omitted. For example, detailed description of well-known matters and redundant description of substantially the same configurations may be omitted. This is to avoid unnecessary redundancy in the following description and to facilitate understanding by those skilled in the art.

The accompanying drawings and the following description are provided to allow those skilled in the art to fully understand the present disclosure. The accompanying drawings and the following description are not intended to limit the subject matter defined in the claims.

[1.1. Structure of Device]

Figure 4A:
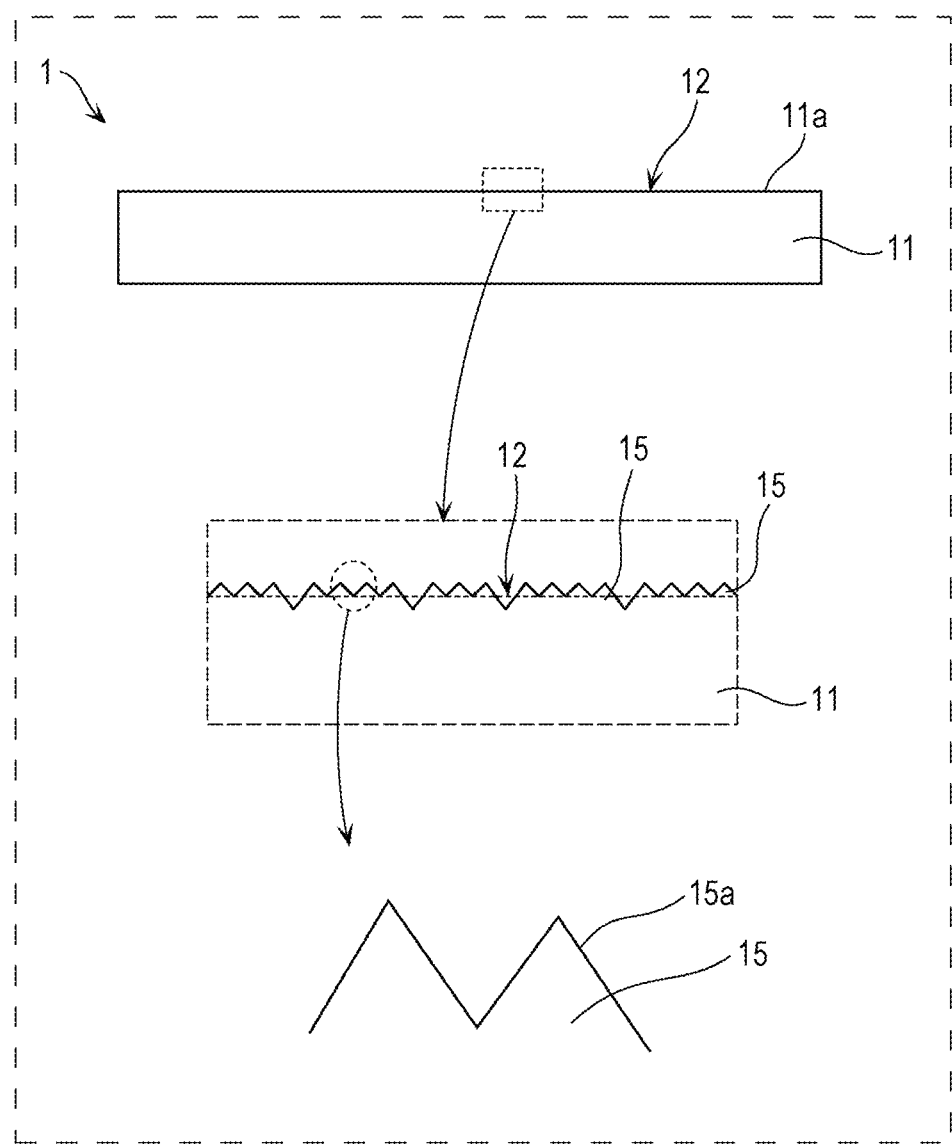
FIG. 4A is a schematic illustration of a cross section of a device in embodiment 1.

FIG. 4A is a schematic illustration of a cross section of a device 1 in embodiment 1.

The device 1 includes a GaN-based semiconductor 11 having a crystal face 12 inclined with respect to the c-plane.

The GaN-based semiconductor 11 is a nitride semiconductor represented by AlxGayInzN (0≤x, y, z≤1, x+y+z=1). For example, the GaN-based semiconductor 11 may be a GaN substrate formed entirely of GaN or may be a substrate prepared by forming a nitride semiconductor on part or the whole of a principal surface 11a of an $Al_2O_3$ substrate, a SiC substrate, a Si substrate, etc. In the present embodiment, the GaN-based semiconductor 11 is a GaN substrate.

The GaN-based semiconductor 11 has, on the principal surface 11a of the substrate, the crystal face 12 inclined 0.4° with respect to the c-plane. The inclination angle of the crystal face 12 with respect to the c-plane can be appropriately selected within the range of from 0.05° to 15° inclusive (see FIG. 3E).

An irregular portion 15 is provided on the crystal face 12 of the GaN-based semiconductor 11. Specifically, the crystal face 12 has an irregular region in which the irregular portion 15 is formed. When the irregular portion 15 is provided on the crystal face 12, the surface area of the crystal face 12 is larger than that when the crystal face 12 is flat.

A plurality of concave sections and a plurality of convex sections in the irregular portion 15 have irregular shapes. The plurality of concave sections and the plurality of convex sections are formed at random positions on the crystal face 12.

For example, the mean width of roughness profile elements (RSm) of the crystal face 12 is from 0.8 μm to 1,000 μm inclusive. The arithmetic mean roughness of the roughness profile elements (Ra) of the crystal face 12 is from 10 nm to 800 nm inclusive. The mean width RSm is the mean pitch of the concave and convex sections, and the arithmetic mean roughness Ra is the mean of the heights (absolute values) of the concave and convex sections. These are defined by Japanese Industrial Standards (JIS) B 0601:2001. The mean width (RSm) and arithmetic mean roughness (Ra) of the crystal face 12 are measurement values with a line parallel to the principal surface 11a of the GaN substrate used as a measurement reference line. The mean width (RSm) and the arithmetic mean roughness (Ra) can be measured, for example, using a laser microscope.

A surface 15a of the irregular portion 15 is hydrophilic. The boundary between hydrophilicity and hydrophobicity is a contact angle of 90°. When the contact angle is less than 90°, the surface is hydrophilic. When the contact angle is more than 90°, the surface is hydrophobic. The surface 15a of the irregular portion 15 may be superhydrophilic. The superhydrophilicity means that, in contact angle measurement using pure water, the contact angle is 10° or less or is at the limit of measurement (0°).

Apex portions of at least some of the plurality of convex sections may be formed from a material different from the material of the rest of the irregular portion 15. Specifically, the apex portions of the convex sections may be formed of one or a combination of a plurality of materials selected from the group consisting of $SiO_2$, $TiO_2$, ZnO, Au, Ag, polystyrene, benzoguanamine-melamine-formaldehyde condensates, and polymethyl methacrylate-based cross-linked products.

Figure 4B:
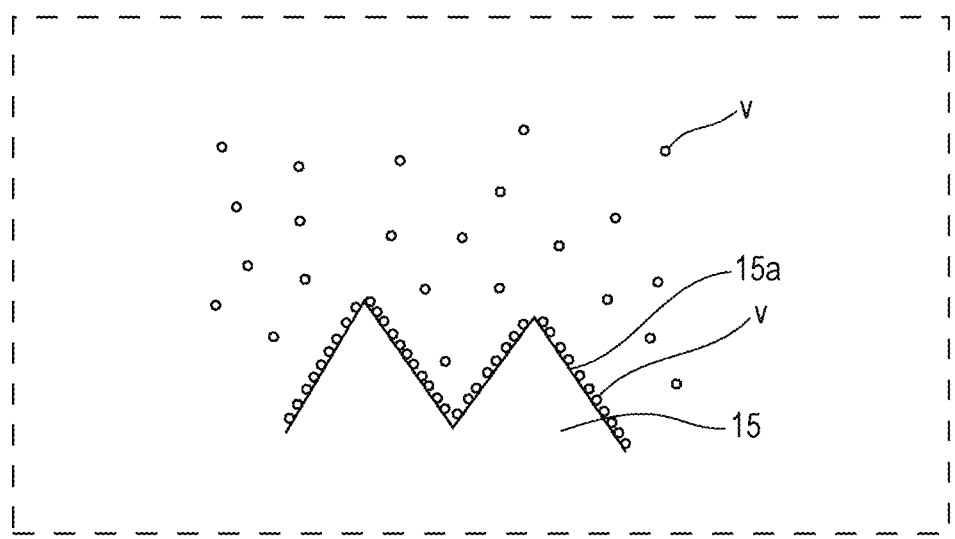
FIG. 4B is an illustration showing how the device in embodiment 1 collects water vapor in air.

FIG. 4B is an illustration showing how the device 1 collects water vapor v in air.

As described above, in the device 1, the surface 15a of the irregular portion 15 of the crystal face 12 is hydrophilic. When the device 1 is exposed to air, water vapor v tends to gather in the irregular portion 15. Therefore, the water vapor v adheres to the surface 15a of the irregular portion 15 and is collected. Since the device 1 has the irregular portion 15 on the crystal face 12, the crystal face 12 has an increased surface area. This allows the crystal face 12 to collect a large amount of water vapor v, and the collected water vapor v forms water droplets on the irregular portion 15, i.e., on the crystal face 12. In this manner, the device 1 can generate water.

[1.2. Method for Producing Device]

FIG. 4C is a flowchart showing an example of a method for producing the device 1.

The method for producing the device 1 includes: preparing a GaN-based semiconductor 11 (step S0), modifying the crystal face (steps S1 and S2), placing particles (step S3), forming the irregular portion (step S4), and modifying the surface of the irregular portion (steps S5 and S6). The step of modifying the crystal face includes organic solvent cleaning (step S1) and ultraviolet irradiation (step S2). The step of modifying the surface of the irregular portion includes organic solvent cleaning (step S5) and ultraviolet irradiation (step S6).

Figure 5A:
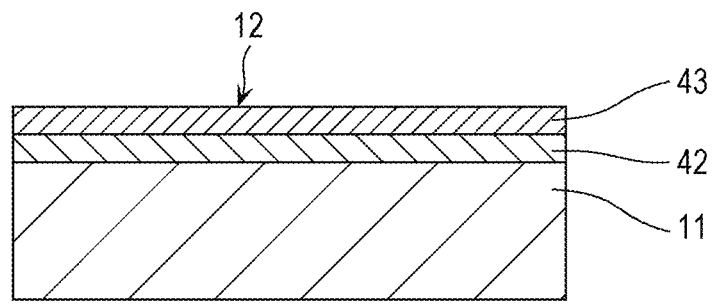
FIG. 5A is a schematic illustration showing a cross section of an untreated GaN-based semiconductor in embodiment 1 (a gallium nitride-based semiconductor having a crystal face inclined from 0.05° to 15° inclusive with respect to the c-plane)
Figure 5B:
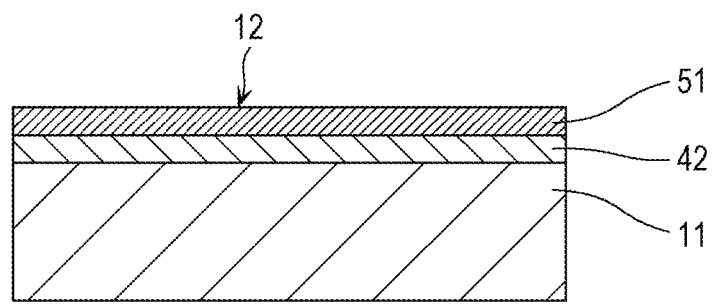
FIG. 5B is a schematic illustration showing a cross section after the crystal face of the GaN-based semiconductor in embodiment 1 is subjected to organic solvent cleaning.
Figure 5C:
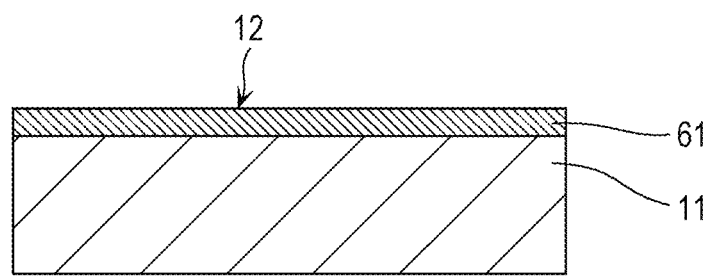
FIG. 5C is a schematic illustration showing a cross section after the crystal face of the GaN-based semiconductor in embodiment 1 is irradiated with ultraviolet light.
Figure 5D:
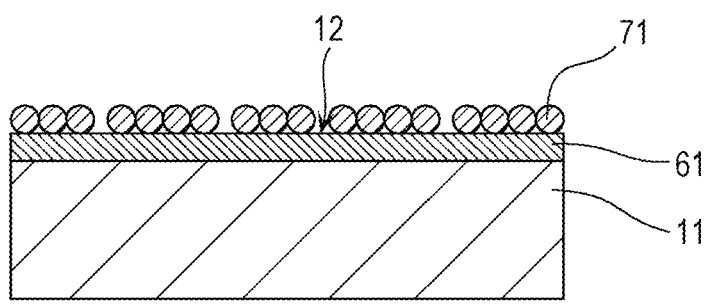
FIG. 5D is a schematic illustration showing a cross section with colloidal particles placed on the crystal face of the GaN-based semiconductor in embodiment 1 (FIG. 5D corresponds to S3)
Figure 5E:
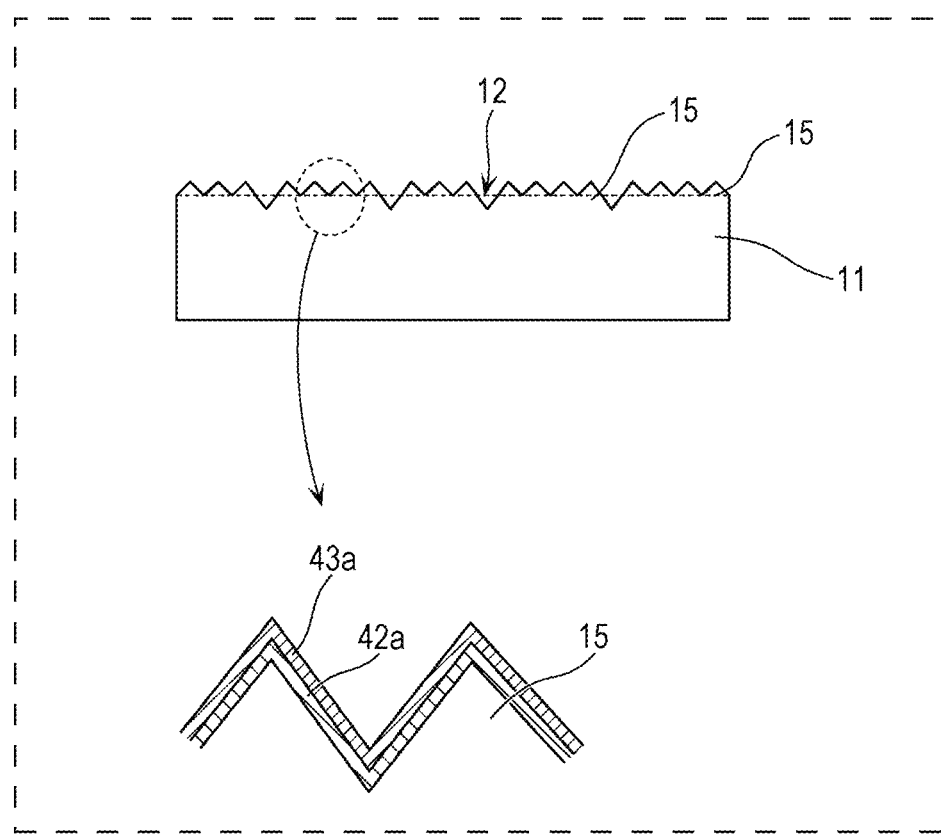
FIG. 5E is a schematic illustration showing a cross section with an irregular portion formed on the crystal face of the GaN-based semiconductor in embodiment 1.
Figure 5F:
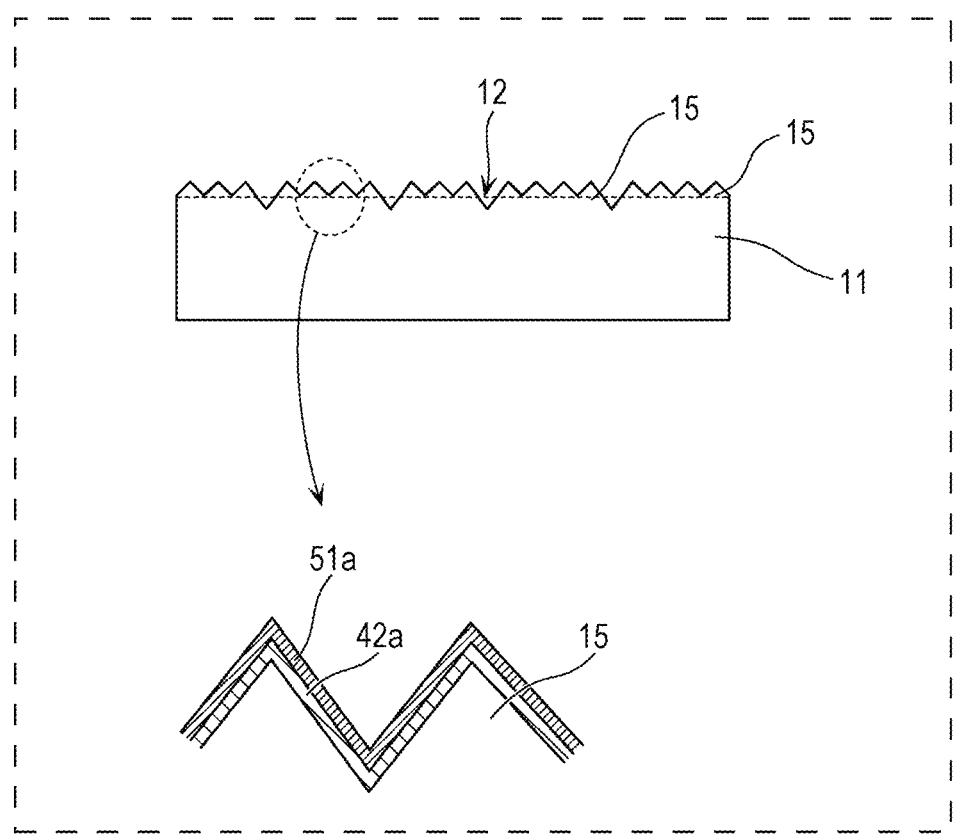
FIG. 5F is a schematic illustration showing a cross section after the irregular portion of the GaN-based semiconductor in embodiment 1 is subjected to organic solvent cleaning.
Figure 5G:
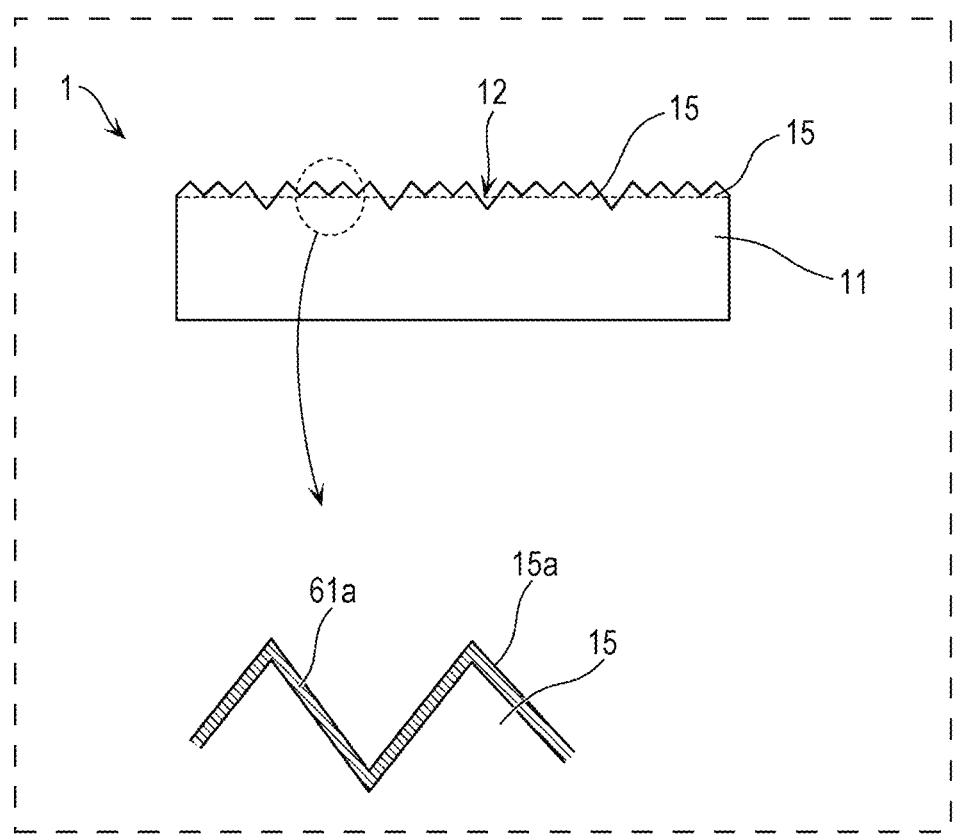
FIG. 5G is a schematic illustration showing a cross section after the irregular portion of the GaN-based semiconductor in embodiment 1 is irradiated with ultraviolet light (FIG. 5G corresponds to S6)

FIG. 5A is a schematic illustration showing a cross section of an untreated GaN-based semiconductor 11 (FIG. 5A corresponds to step S0). FIG. 5B is a schematic illustration showing a cross section after the crystal face 12 of the GaN-based semiconductor 11 is subjected to organic solvent cleaning (FIG. 5B corresponds to step S1). FIG. 5C is a schematic illustration showing a cross section after the crystal face 12 of the GaN-based semiconductor 11 is irradiated with ultraviolet light (FIG. 5C corresponds to step S2). FIG. 5D is a schematic illustration showing a cross section with colloidal particles 71 placed on the crystal face 12 of the GaN-based semiconductor 11 (FIG. 5D corresponds to step S3). FIG. 5E is a schematic illustration showing a cross section with the irregular portion 15 formed on the crystal face 12 of the GaN-based semiconductor 11 (FIG. 5E corresponds to step S4). FIG. 5F is a schematic illustration showing a cross section after the irregular portion 15 of the GaN-based semiconductor 11 is subjected to organic solvent cleaning (FIG. 5F corresponds to step S5). FIG. 5G is a schematic illustration showing a cross section after the irregular portion 15 of the GaN-based semiconductor 11 is irradiated with ultraviolet light (FIG. 5G corresponds to step S6).

First, the GaN-based semiconductor 11 is prepared (step S0).

Specifically, the GaN-based semiconductor 11 prepared is a GaN substrate having a crystal face 12 inclined from 0.05° to 15° inclusive with respect to the c-plane.

For example, in a crystal face 12 inclined 0.05° with respect to the c-plane, one step is present at each of opposite edges of a 296.22 nm-wide terrace composed of GaN atoms in the c-plane. In a crystal face 12 inclined 15° with respect to the c-plane, one step is present at each of opposite ends of a 0.96 nm-wide terrace composed of GaN atoms in the c-plane. These steps are chemically active, so that a more stable structure, e.g., gallium oxide, is likely to be formed. In the GaN-based semiconductor 11 having the above-described crystal face 12, a terrace structure having a width of form 1 nm to 300 nm inclusive is formed periodically, and this is suitable for arranging the colloidal particles 71, which are nanoparticle having a diameter of $10^{-9}$ m to $10^{-6}$ m described later. Specifically, in the GaN-based semiconductor 11 having the crystal face 12 inclined from 0.05° to 15° inclusive with respect to the c-plane, the nanoparticles having a diameter of from $10^{-9}$ m to $10^{-6}$ m inclusive can be regularly arranged. This allows periodic concave and convex sections to be formed on the crystal face 12. By subjecting the resulting crystal face 12 to modification treatment, superhydrophilicity can be imparted to the crystal face 12.

As shown in FIG. 5A, the GaN-based semiconductor 11 prepared has, on its surface, a cleaned GaN-based semiconductor layer 42. In FIG. 5A, the cleaned GaN-based semiconductor layer 42 is illustrated so as to be distinguishable from the GaN-based semiconductor 11 in bulk form. In practice, no clear interface is present between the cleaned GaN-based semiconductor layer 42 and the GaN-based semiconductor 11.

The cleaned GaN-based semiconductor layer 42 is formed as a result of cleaning with an acid solution such as hydrofluoric acid, phosphoric acid, or sulfuric acid, cleaning with pure water, or cleaning with a combination of an acid solution and pure water. A terminal layer 43 is formed on the outermost surface of the cleaned GaN-based semiconductor layer 42. The terminal layer 43 is formed of, for example, hydrocarbons, hydroxy groups (—OH groups), hydrogen atoms (H), oxygen atoms (O), etc. As described above, even when the surface of the GaN-based semiconductor 11 is purified by cleaning, impurities terminated with atoms or molecules other than the atoms forming the GaN-based semiconductor 11 are present on the surface of the GaN-based semiconductor 11 exposed to air, and Ga and N are not directly exposed at the outermost surface.

Next, the GaN-based semiconductor 11 prepared in step S0 is subjected to organic solvent cleaning (step S1).

The organic solvent cleaning allows excessive organic substances adhering to the surface of the GaN-based semiconductor 11 to be removed. As a result of organic solvent cleaning, the terminal layer 43 formed on the outermost surface is replaced with an organic solvent-cleaned layer 51 as shown in FIG. 5B. In practice, no clear interface is present between the organic solvent-cleaned layer 51 and the cleaned GaN-based semiconductor layer 42.

The organic solvent used for the organic solvent cleaning contains, for example, one or a combination of a plurality of solvents selected from the group consisting of acetone, methanol, ethanol, and isopropyl alcohol. Cleaning with pure water may be performed after the organic solvent cleaning. By performing the organic solvent cleaning, organic substances can be effectively removed by ultraviolet irradiation in the next step.

Next, the GaN-based semiconductor 11 subjected to the organic solvent cleaning is irradiated with ultraviolet light (step S2).

As a result of irradiation with ultraviolet light, a surface-modified layer 61 is formed on the surface of the GaN-based semiconductor 11 as shown in FIG. 5C. Specifically, as a result of irradiation with ultraviolet light, almost all the organic solvent-cleaned layer 51 is removed, and the cleaned GaN-based semiconductor layer 42 is converted to the surface-modified layer 61. The surface-modified layer 61 is a layer formed by removing, from a surface region, —OH groups or an impurity layer containing at least —OH groups. The surface-modified layer 61 may be a layer formed by oxidizing the surface of the GaN-based semiconductor 11. The surface of the surface-modified layer 61 is the crystal face 12 inclined with respect to the c-plane. The thickness of the surface-modified layer 61 is, for example, from 0.1 nm to 10 nm inclusive. However, no clear interface is present between the surface-modified layer 61 and the GaN-based semiconductor 11.

The ultraviolet irradiation is performed in an atmosphere containing at least oxygen atoms (e.g., in air) or in a liquid containing at least oxygen atoms. For example, the ultraviolet irradiation may be performed with oxygen supplied to the crystal face 12 of the GaN-based semiconductor 11 that is to be subjected to surface modification. The ultraviolet irradiation may be performed in pure water or hydrogen peroxide or may be performed with activated oxygen (e.g., ozone) and/or oxygen radicals supplied to the crystal face 12. When oxygen radicals are supplied to the crystal face 12, inductively coupled oxygen gas discharge, for example, may be used to form the oxygen radicals. To generate radicals emitting ultraviolet light through oxygen gas discharge, argon or water may be added to the oxygen gas.

When the energy of photons of the ultraviolet light used for the irradiation is larger than the bandgap of the crystal face of the nitride semiconductor that is to be subjected to surface modification, the crystal face can be activated to facilitate reactions. A mercury lamp may be used as the light source of the ultraviolet light. For example, when the surface to be subjected to surface modification is GaN, a wavelength of 364 nm or less may be used, and ultraviolet light with a wavelength of 313 nm, 297 nm, 254 nm, or 185 nm, which is a mercury emission line, may be used. When the surface to be subjected to surface modification is InGaN, ultraviolet light with a wavelength of 365 nm or 405 nm, which is a mercury emission line, may be used. A blacklight with a wavelength of 352 nm may be used as the light source of the ultraviolet light. Specifically, the wavelength of the ultraviolet light used in the ultraviolet irradiation step includes one or a combination of a plurality of wavelengths selected from the group consisting of 352 nm, 313 nm, 297 nm, 254 nm, and 185 nm.

In the present embodiment, the wavelength of the ultraviolet light may be equal to or less than 362 nm, which is the wavelength of ultraviolet light that can be absorbed by GaN itself. The wavelength of the ultraviolet light may be a short wavelength of 300 nm or less at which hydroxy radicals having strong oxidative power are generated. The wavelength of the ultraviolet light may be in a wavelength range around 254 nm in order to decompose ozone. Light with a very short wavelength of 185 nm may also be used.

The preparation step S0 of preparing the GaN-based semiconductor 11, the organic cleaning step S1, and the ultraviolet irradiation step S2 described above are performed in this order, and a surface-modified semiconductor with the crystal face 12 modified can thereby be obtained.

The surface-modified layer 61 of the GaN-based semiconductor 11 exhibits superhydrophilicity. Specifically, in the measurement of a contact angle using pure water, the contact angle is 10° or less or is at the limit of measurement (0°). Since the hydrophilicity of the surface-modified layer 61 is very high, a hydrophilic solution, for example, can be uniformly applied to the surface of the surface-modified layer 61.

Next, as shown in FIG. 5D, a plurality of colloidal particles 71 are placed on the surface-modified layer 61 of the GaN-based semiconductor 11 (step S3). The colloidal particles 71 are particles of submicron size ($10^{-9}$ m to $10^{-6}$ m). The plurality of colloidal particles 71 are placed on the surface-modified layer 61 so as to be substantially close-packed.

To place the colloidal particles 71 on the surface-modified layer 61, a self-ordering process of the colloidal solution using a dip coating method may be used. In this step, for example, the type of the solvent of the colloidal solution, the type of the solute of the colloidal solution, the concentration of the colloidal solution, and the withdrawal rate during dip coating may be controlled.

The solvent used may be a polar solvent having a high solubility parameter such as water, methanol, ethanol, phenol, ethylene glycol, or acetic acid. Specifically, the solvent may contain one or a combination of a plurality of solvents selected from the group consisting of water, methanol, ethanol, phenol, ethylene glycol, and acetic acid. These are hydrophilic and easily available, so that high mass productivity is achieved. Pure water may be used as the solvent.

The solute used may be a spherical hydrophilic solute with a narrow particle size distribution such as $SiO_2$, $TiO_2$, ZnO, Au, Ag, polystyrene, a benzoguanamine-melamine-formaldehyde condensate, or a polymethyl methacrylate-based crosslinked product. Specifically, the solute in the present embodiment, i.e., the plurality of particles dispersed in the solvent, includes one or a combination of a plurality of solutes selected from the group consisting of $SiO_2$, $TiO_2$, ZnO, Au, Ag, polystyrene, benzoguanamine-melamine-formaldehyde condensates, and polymethyl methacrylate-based crosslinked products. These particles are excellent in productivity, so that high mass productivity is achieved.

The concentration of the colloidal solution is, for example, 10 vol % or less. The withdrawal rate during dip coating is, for example, 10 cm/h or less.

After the GaN-based semiconductor 11 having the surface-modified layer 61 is immersed in the hydrophilic colloidal solution, the GaN-based semiconductor 11 is withdrawn from the colloidal solution. This allows the colloidal particles 71 to be placed on the crystal face 12 substantially uniformly.

Next, as shown in FIG. 5E, the irregular portion 15 is formed on the crystal face 12 on which the plurality of colloidal particles 71 are placed (step S4).

The irregular portion 15 is formed by etching the crystal face 12 of the GaN-based semiconductor 11 while the plurality of colloidal particles 71 placed on the crystal face 12 are used as a mask. In this case, not only the crystal face 12 of the GaN-based semiconductor 11 but also the plurality of colloidal particles 71 are etched, and irregularities depending on the arrangement pattern of the colloidal particles 71 are formed on the crystal face 12 of the GaN-based semiconductor 11.

The etching is dry etching using, for example, a chlorine-based gas (such as $Cl_2$ or $BCl_3$). The size and shape of the convex sections in the irregular portion 15 can be controlled by adjusting the time of etching or the conditions of etching.

The mean width of the roughness profile elements (RSm) of the crystal face 12 on which the irregular portion 15 is formed is in the range of from 0.8 µm to 1,000 µm inclusive. The arithmetic mean roughness of the roughness profile elements (Ra) of the crystal face 12 on which the irregular portion 15 is formed is in the range of from 10 nm to 800 nm inclusive.

The irregular portion 15 includes a plurality of concave sections or convex sections having random shapes, and the plurality of concave sections or convex sections are present at random positions on the crystal face 12. This may be because the mask formed from the plurality of colloidal particles 71 has a complicated shape having many holes. Irregular portions 15 having various shapes can be formed by controlling the shape, size, material, and size distribution of the colloidal particles 71 and the etching conditions.

Some of the plurality of colloidal particles 71 placed on the crystal face 12 may not be fully etched and remain on apex portions of the convex sections. In this case, the apex portions of at least some of the plurality of convex sections are formed of a material different from the material of the rest of the irregular portion 15.

As shown in FIG. 5E, the irregular portion 15 has a cleaned GaN-based semiconductor layer 42a on its surface. The cleaned GaN-based semiconductor layer 42a is formed as a result of cleaning with an acid solution such as hydrofluoric acid, phosphoric acid, or sulfuric acid, cleaning with pure water, or cleaning with a combination of an acid solution and pure water. A terminal layer 43a is formed on the outermost surface of the cleaned GaN-based semiconductor layer 42a. The terminal layer 43a is formed of, for example, hydrocarbons, hydroxy groups (—OH groups), hydrogen atoms (H), oxygen atoms (O), etc.

Next, the GaN-based semiconductor 11 on which the irregular portion 15 is formed is subjected to organic solvent cleaning (step S5).

The organic solvent cleaning allows excessive organic substances adhering to the surface of the irregular portion 15 to be removed. As a result of organic solvent cleaning, the terminal layer 43a formed on the outermost surface is replaced with an organic solvent-cleaned layer 51a, as shown in FIG. 5F.

The organic solvent used for the organic solvent cleaning includes, for example, one or a combination of a plurality of solvents selected from the group consisting of acetone, methanol, ethanol, and isopropyl alcohol. After the organic solvent cleaning, cleaning with pure water may be performed.

Next, the irregular portion 15 subjected to the organic solvent cleaning is irradiated with ultraviolet light (step S6).

As a result of ultraviolet irradiation, a surface-modified layer 61a is formed on the surface 15a of the irregular portion 15 as shown in FIG. 5G. Specifically, as a result of ultraviolet irradiation, almost all the organic solvent-cleaned layer 51a is removed, and the cleaned GaN-based semiconductor layer 42a is converted to the surface-modified layer 61a. The surface-modified layer 61a of the irregular portion 15 is a layer formed by removing, from its surface region, —OH groups or an impurity layer containing at least —OH groups. The surface-modified layer 61a may be a layer formed by oxidizing the surface of the GaN-based semiconductor 11.

The ultraviolet irradiation is performed in an atmosphere containing at least oxygen atoms (e.g., in air) or in a liquid containing at least oxygen atoms. The wavelength of the ultraviolet light used in the ultraviolet irradiation step is one or a combination of a plurality of wavelengths selected form the group consisting of 352 nm, 313 nm, 297 nm, 254 nm, 185 nm, 365 nm, and 405 nm.

As described above, the preparation step S0 of preparing the GaN-based semiconductor 11, the organic solvent cleaning step S1, the ultraviolet irradiation step S2, the particle placing step S3, the irregular portion forming step S4, the organic solvent cleaning step S5, and the ultraviolet irradiation step S6 are performed in this order, and the device 1 is thereby produced. The surface 15a of the irregular portion 15 of the crystal face 12 of the device 1 is superhydrophilic. By bringing the device 1 into contact with air, water vapor v in the air can be collected.

The effects of surface modification treatment in the above-described crystal face modification steps (51 and S2) and the above-described irregular portion surface modification steps (S5 and S6) may be caused by the following actions.

Ultraviolet light having a higher energy than the bandgap energy of the GaN-based semiconductor 11 is not fully transmitted through the GaN-based semiconductor 11 and is absorbed thereby, and excitons are generated in the GaN-based semiconductor 11, so that reactivity on the surface of the GaN-based semiconductor 11 is increased. The increased reactivity acts such that impurities such as organic substances present on the GaN surface inclined with respect to the GaN c-plane are desorbed. In addition, during irradiation with the ultraviolet light, oxygen contained in air is activated, and the activated oxygen is supplied to the GaN-based semiconductor 11.

Moreover, hydroxy radicals (OH radicals) generated by the ultraviolet light decompose the impurities such as organic substances that have been rendered easily removable from the GaN surface, and the amount of the organic and OH components on the surface of the GaN-based semiconductor 11 is thereby reduced.

The effects of the ultraviolet irradiation are as follows. The —OH groups on the surface of the GaN-based semiconductor 11 are converted to hydroxy radicals having strong oxidative power. Oxygen contained in air is activated, and the activated oxygen is supplied to the GaN-based semiconductor 11. As a result of absorption of the ultraviolet light, the reactivity on the surface of the GaN-based semiconductor 11 is increased.

The effect of the organic solvent cleaning steps performed before the ultraviolet irradiation steps may be that excessive organic components present on the GaN surface are removed. For example, if only ultraviolet irradiation is performed without organic solvent cleaning, the activated oxygen generated by the ultraviolet irradiation is used to remove the excessive organic substances present on the GaN surface, and the oxidation of the GaN surface may not be promoted sufficiently. However, when organic solvent cleaning is performed before ultraviolet irradiation, the excessive organic components are removed in advance, so that the oxidation of the GaN surface by the ultraviolet irradiation can be promoted.

Embodiment 2

[2. Surface-Modified Semiconductor and Method for Producing the Same]

A surface-modified semiconductor in embodiment 2 is produced by performing, in the following order, the preparation step S0, the organic solvent cleaning step S1, and the ultraviolet irradiation step S2 shown in embodiment 1.

The surface-modified semiconductor includes: a GaN-based semiconductor 11 having a crystal face 12 inclined from 0.05° to 15° inclusive with respect to the c-plane; and a surface-modified layer 61 formed on the crystal face 12. The surface of the surface-modified layer 61 is superhydrophilic. Specifically, the crystal face 12 of the GaN-based semiconductor 11 is inclined 0.4° with respect to the c-plane. Specifically, the GaN-based semiconductor 11 is, for example, a GaN substrate.

A method for producing the surface-modified semiconductor includes: preparing the GaN-based semiconductor 11 having the crystal face 12 inclined from 0.05° to 15° inclusive with respect to the c-plane (step S0); subjecting the GaN-based semiconductor 11 to organic solvent cleaning (step S1); and irradiating the crystal face 12 with ultraviolet light with the crystal face 12 exposed to a gas containing oxygen atoms or oxygen molecules or a liquid containing oxygen atoms or oxygen molecules (step S2).

Through steps S0 to S2, the surface-modified semiconductor including the surface-modified layer 61 formed on the crystal face 12 of the GaN-based semiconductor 11 can be obtained.

For example, step S1 of subjecting the GaN-based semiconductor 11 to organic solvent cleaning may be the step of performing organic solvent cleaning using a solvent containing at least one selected from the group consisting of acetone, methanol, ethanol, and isopropyl alcohol. The light source of the ultraviolet light used in the ultraviolet irradiation step S2 may be a mercury lamp.

With the surface-modified semiconductor production method in the present embodiment, the surface state of the GaN-based semiconductor 11 having a large area can be modified in a short time at low cost, and the wettability of the GaN-based semiconductor 11 can be easily controlled.

For example, wettability of the GaN-based semiconductor 11 in a solution treatment step can be increased. Therefore, when a resist for photolithography is applied, the uniformity of the thickness of the resist can be improved. Moreover, in the particle placing step, the colloidal particles 71 can be uniformly arranged on the surface of the surface-modified layer 61.

Embodiment 3

[3. Method for Placing Particles]

A method for placing particles in embodiment 3 includes the preparation step S0, the organic solvent cleaning step S1, the ultraviolet irradiation step S2, and the particle placing step S3 shown in embodiment 1.

In this method, a plurality of particles are placed on the surface of a semiconductor. The method includes: preparing a surface-modified semiconductor including a GaN-based semiconductor 11 having a crystal face 12 inclined from 0.05° to 15° inclusive with respect to the c-plane and a surface-modified layer 61 formed on the crystal face 12, the surface of the surface-modified layer 61 being superhydrophilic; immersing the surface-modified semiconductor in a hydrophilic solution containing a plurality of particles; and withdrawing, from the solution, the surface-modified semiconductor immersed in the solution.

The surface-modified semiconductor can be produced through the preparation step S0, the organic solvent cleaning step S1, and the ultraviolet irradiation step S2 described above.

Specifically, the plurality of particles contained in the solution are colloidal particles 71 and are hydrophilic. The surface of the plurality of particles contained in the solution may be subjected to hydrophilic treatment in advance. The plurality of particles contain at least one selected from the group consisting of $SiO_2$, $TiO_2$, ZnO, Au, Ag, polystyrene, benzoguanamine-melamine-formaldehyde condensates, and polymethyl methacrylate-based crosslinked products.

The solution contains at least one selected from the group consisting of water, methanol, ethanol, phenol, ethylene glycol, and acetic acid.

Through these steps, the plurality of colloidal particles 71 can be uniformly placed on the surface of the semiconductor.

Embodiment 4

[4. Gallium Nitride-Based Semiconductor Device and Method for Producing the Same]

A gallium nitride-based semiconductor device in embodiment 4 can be produced by performing, in the following order, the preparation step S0, the organic solvent cleaning step S1, the ultraviolet irradiation step S2, the particle placing step S3, the irregular portion forming step S4, the organic solvent cleaning step S5, and the ultraviolet irradiation step S6 shown in embodiment 1.

The GaN-based semiconductor device has an irregular region in which irregularities are formed on at least part of a crystal face 12 inclined from 0.05° to 15° inclusive with respect to the c-plane. The mean width of roughness profile elements (RSm) in the irregular region is from 0.8 µm to 1,000 µm inclusive. In apex portions of at least some of convex sections of the irregular region, a material different from the material of the rest of the irregular region is present. The irregular region is a region of the crystal face 12 in which the irregular portion 15 is formed.

The irregularities in the irregular region have random shapes. The convex sections of the irregular region are formed at random positions on the crystal face 12. The number density of the convex sections of the irregular region is in the range of from $1/\mu m^2$ to $120/\mu m^2$ inclusive. The arithmetic mean roughness (Ra) of the irregular region is from 10 nm to 800 nm inclusive.

The crystal face 12 is inclined 0.4° with respect to the c-plane. The GaN-based semiconductor 11 is a GaN substrate. The material different from the material of the rest of the irregular region is formed of at least one selected from the group consisting of $SiO_2$, $TiO_2$, ZnO, Au, Ag, polystyrene, benzoguanamine-melamine-formaldehyde condensates, and polymethyl methacrylate-based crosslinked products.

This GaN-based semiconductor device is produced by performing the following steps (1) to (4) in the following order.

(1) Preparing a GaN-based semiconductor 11 having a crystal face 12 inclined from 0.05° to 15° inclusive with respect to the c-plane.

(2) Modifying the crystal face 12.

(3) Placing a plurality of particles on the modified crystal face 12.

(4) Dry-etching the crystal face 12 on which the plurality of particles are placed to thereby form irregularities on at least part of the etched crystal face 12, the mean width of roughness profile elements (RSm) of the irregularities being from 0.8 µm to 1,000 µm inclusive.

The step of placing the plurality of particles includes: immersing the modified crystal face 12 in a solution containing the plurality of particles; and withdrawing, from the solution, the crystal face 12 immersed in the solution.

The solution is hydrophilic and is at least one selected from the group consisting of water, methanol, ethanol, phenol, ethylene glycol, and acetic acid.

The surfaces of the plurality of particles are hydrophilic. The plurality of particles are formed from at least one selected from the group consisting of $SiO_2$, $TiO_2$, ZnO, Au, Ag, polystyrene, benzoguanamine-melamine-formaldehyde condensates, and polymethyl methacrylate-based cross-linked products.

The step of modifying the crystal face 12 includes exposing the unmodified crystal face 12 to an atmosphere containing oxygen atoms to thereby oxidize the crystal face 12.

This GaN-based semiconductor device can be used for, for example, building wall materials for temperature control or fins of heat exchangers. When the GaN-based semiconductor device is used for a heat exchanger, not only the efficiency of heat exchange is improved, but also the dehumidification efficiency of an indoor unit of an air conditioner and a dehumidifier can be improved.

Example 1

Example 1 will be described with reference to FIGS. 6A to 6E. In Example 1, the results of contact angle measurement are shown. In the contact angle measurement, 2 μL of water was dropped onto variously processed GaN-based semiconductors 11 each having a crystal face 12 inclined with respect to the c-plane.

First, a plurality of GaN-based semiconductors 11 inclined 0.4° in the m-axis [10-10] direction with respect to the c-plane (0001) were prepared. The results of the contact angle measurement on a GaN-based semiconductor 11 at this point are shown in FIG. 6A.

Next, one of the prepared GaN-based semiconductors 11 was subjected to ultrasonic cleaning with acetone for 3 minutes. Then the resulting GaN-based semiconductor 11 was subjected to ultrasonic cleaning with ethanol for 3 minutes. Then the resulting GaN-based semiconductor 11 was cleaned with pure water for 5 minutes. Then the resulting GaN-based semiconductor 11 was dried using a $N_2$ gas blower. The GaN-based semiconductor 11 subjected to organic solvent cleaning was thereby produced.

Next, the GaN-based semiconductor 11 subjected to the organic solvent cleaning was irradiated with ultraviolet (UV) light for 15 minutes. The ultraviolet irradiation was performed in air. The wavelength of the ultraviolet light was 254 nm, and the irradiation intensity was 1,013 μW/cm² (912 mJ/cm²). The GaN-based semiconductor 11 subjected to the surface modification step was thereby produced. The results of the contact angle measurement on the GaN-based semiconductor 11 subjected to the surface modification treatment are shown in FIG. 6C. Separately, a GaN-based semiconductor 11 subjected only to the ultraviolet irradiation step without the organic solvent cleaning step was prepared and subjected to the contact angle measurement. The results are shown in FIG. 6B.

Figure 6A:
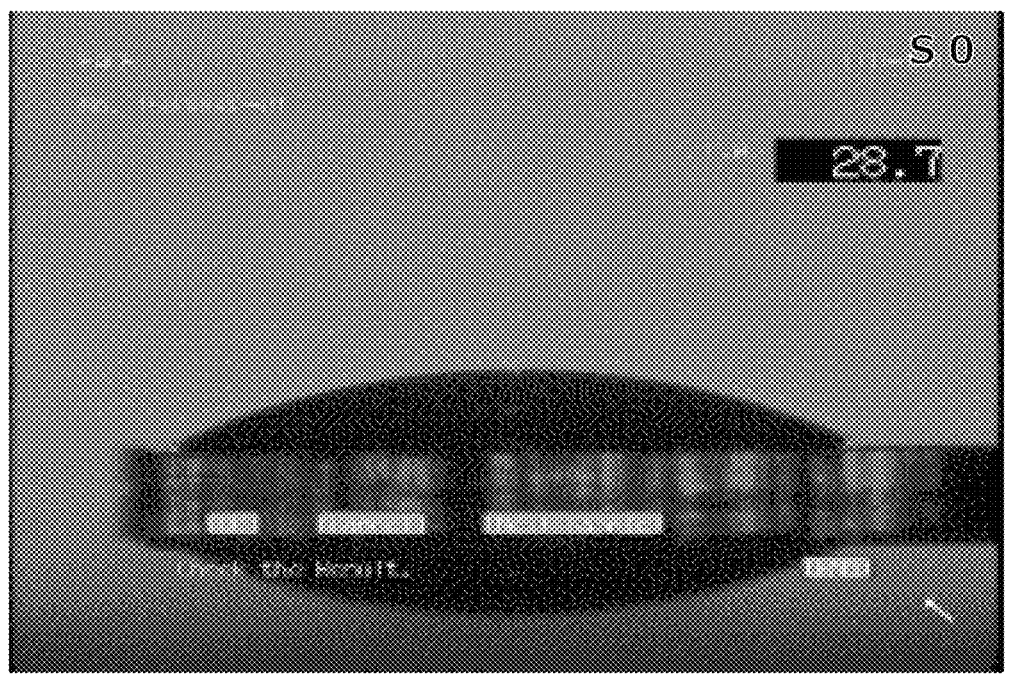
FIG. 6A is a photograph showing the results of contact angle measurement performed by preparing a GaN-based semiconductor in embodiment 1 and dropping water onto the GaN-based semiconductor.

As shown in FIG. 6A, the contact angle on the untreated GaN-based semiconductor 11 (corresponding to a semiconductor after step S0) was 28.7°. However, as shown in FIG. 6C, after the surface modification treatment (i.e., after step S2), the contact angle was changed to 4.2°. This shows that, as a result of the organic solvent cleaning step and the ultraviolet irradiation step, superhydrophilic is imparted to the GaN-based semiconductor 11.

Figure 6B:
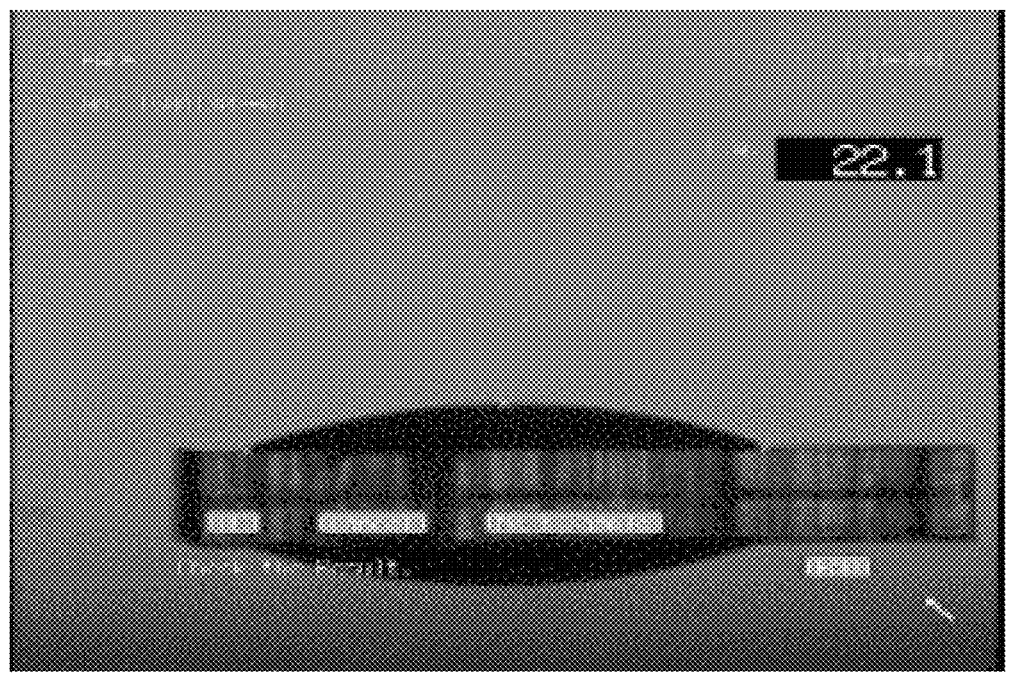
FIG. 6B is a photograph showing the results of contact angle measurement performed by preparing a GaN-based semiconductor in embodiment 1, irradiating the GaN-based semiconductor with ultraviolet light, and then dropping water onto the GaN-based semiconductor.
Figure 6C:
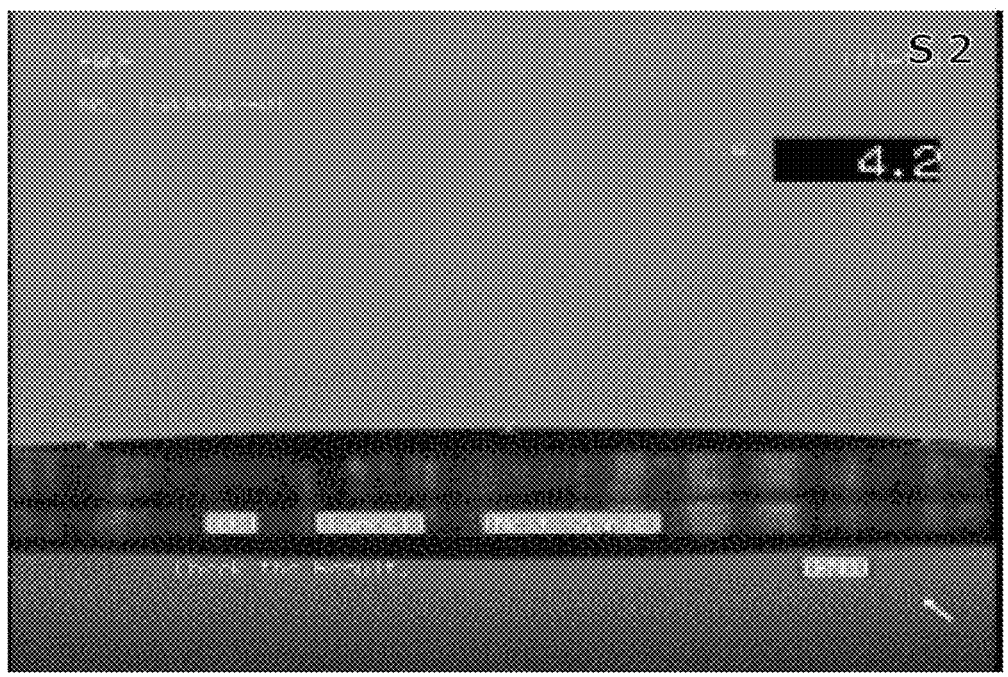
FIG. 6C is a photograph showing the results of contact angle measurement performed by preparing a GaN-based semiconductor in embodiment 1, subjecting the GaN-based semiconductor to organic solvent cleaning and ultraviolet irradiation, and then dropping water onto the GaN-based semiconductor.

As shown in FIG. 6B, even when only the ultraviolet irradiation step was performed without the organic solvent cleaning step, the contact angle was 22.1°. This shows that, even when only the ultraviolet irradiation step is performed, the contact angle is smaller than that on the untreated GaN-based semiconductor.

Figure 6D:
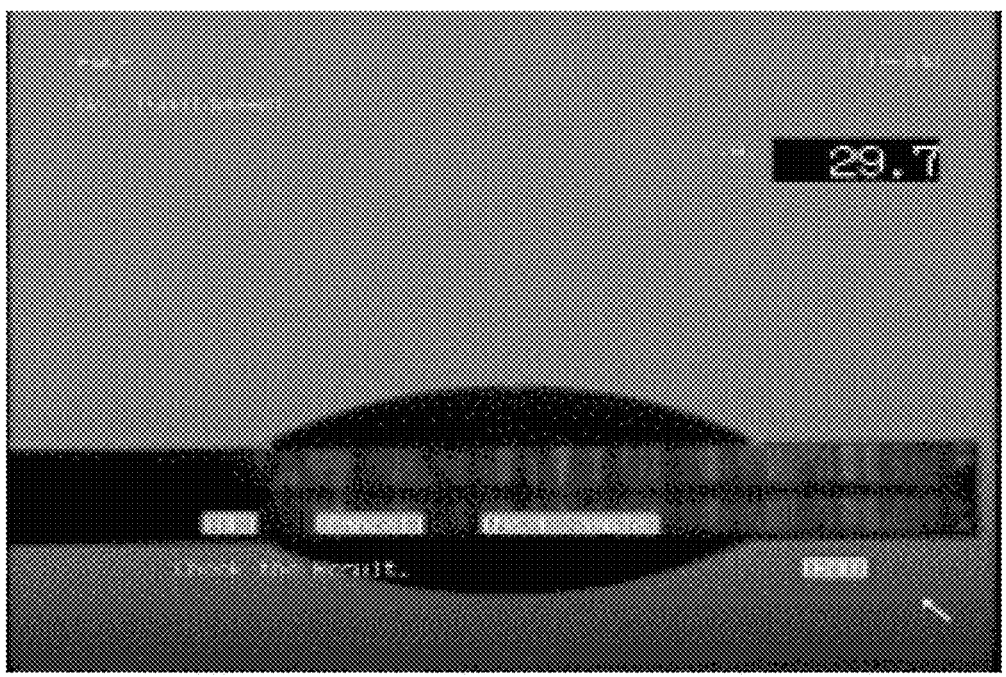
FIG. 6D is a photograph showing the results of contact angle measurement performed by preparing a GaN-based semiconductor in embodiment 1, subjecting its crystal face to organic solvent cleaning and ultraviolet irradiation, exposing the resulting crystal face to air for 16 hours, and then dropping water onto the crystal face.

The surface-modified layer formed through the above steps was left to stand in an air atmosphere for 16 hours, and then 2 μL of pure water was dropped onto the surface-modified layer to perform the contact angle measurement. The results are shown in FIG. 6D. As shown in FIG. 6D, the superhydrophilic surface-modified layer was contaminated in air, and the contact angle was 29.7°. It was found that the hydrophilicity deteriorated.

Figure 6E:
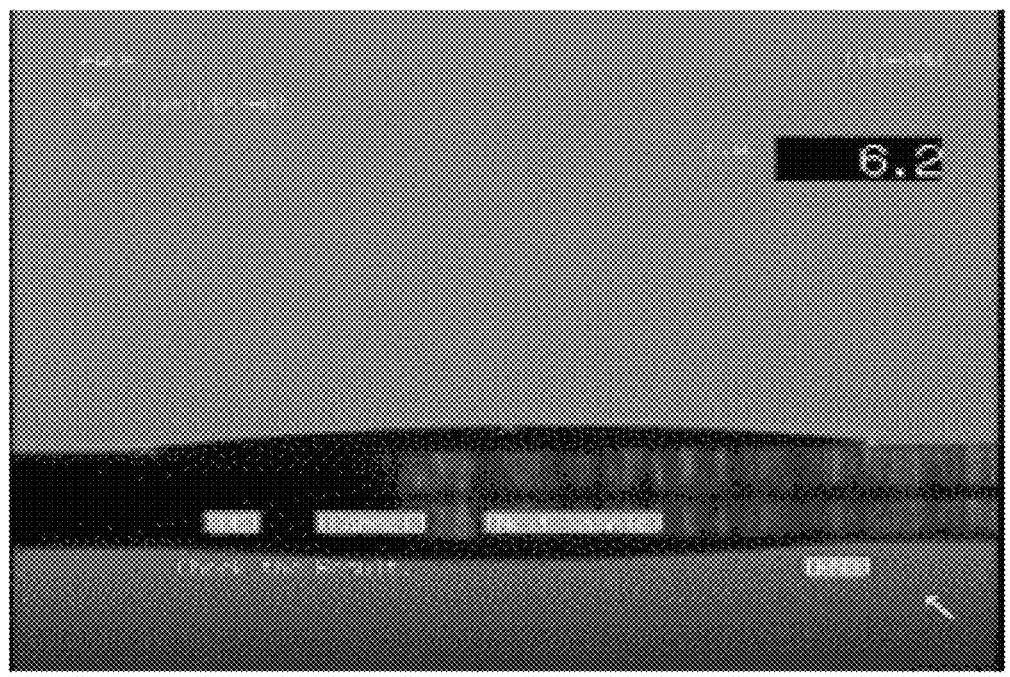
FIG. 6E is a photograph showing the results of contact angle measurement performed by preparing a GaN-based semiconductor in embodiment 1, subjecting its crystal face to organic solvent cleaning and ultraviolet irradiation, exposing the resulting crystal face to air for 16 hours, subjecting the crystal face again to ultraviolet irradiation, and then dropping water onto the crystal face.

The surface-modified layer with deteriorated hydrophilicity was subjected to ultraviolet irradiation in air. Specifically, ultraviolet light having a wavelength of 254 nm was used, and irradiation with the ultraviolet light was performed at an irradiation intensity of 1,013 μW/cm² (912 mJ/cm²) for 15 minutes. The results are shown in FIG. 6E. As shown in FIG. 6E, the contact angle on the surface-modified layer irradiated with the ultraviolet light in air was 6.2°.

This shows that, even when the surface of the GaN-based semiconductor 11 subjected to the surface modification treatment is contaminated, the surface is self-recovered by irradiation with ultraviolet light such as sunlight in air. Therefore, the device in embodiment 1 can maintain its surface-modified state by, for example, exposing the device to sunlight in air, and a reduction in hydrophilicity can be prevented.

Example 2

Example 2 will be described using FIGS. 7, 8A to 8D, 9A, 9B, 10A, 10B, 11A, 11B, 12A, 12B, 13A, and 13B. Example 2 relates to the state of a plurality of colloidal particles 71 placed on a surface-modified GaN-based semiconductor 11 and to a nanometer-scale irregular structure formed from this state.

Figure 7:
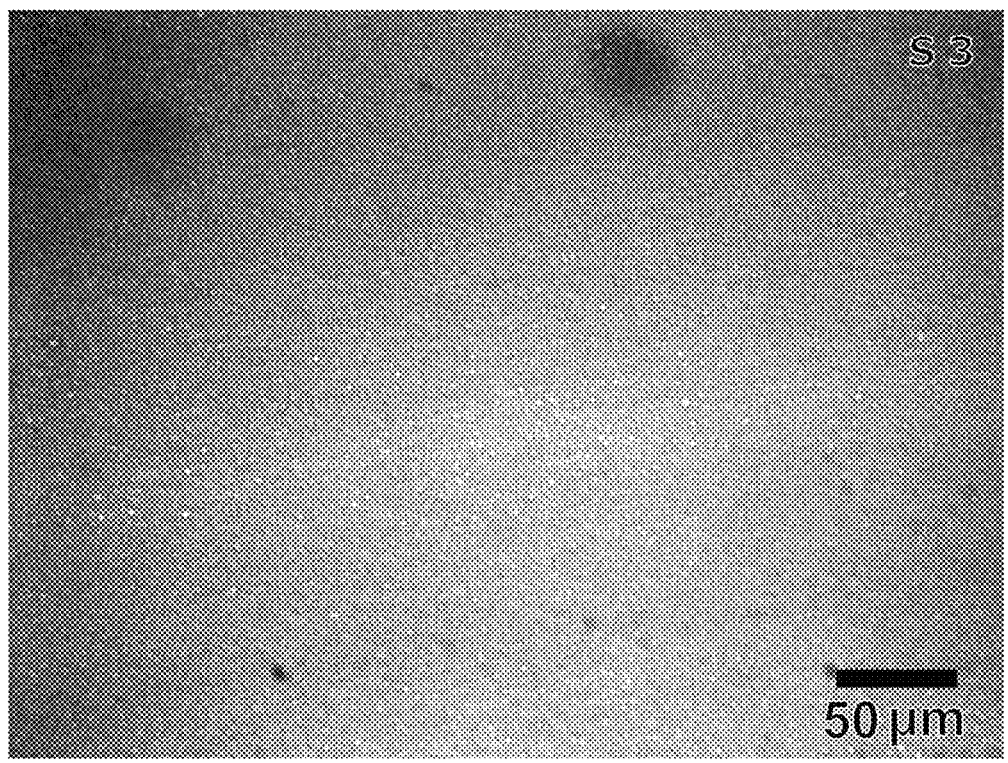
FIG. 7 shows an optical microscope image (magnification: 1000×) of $SiO_2$ nanoparticles having a diameter of 100 nm and arranged on the crystal face of a GaN-based semiconductor in embodiment 1.
Figure 8A:
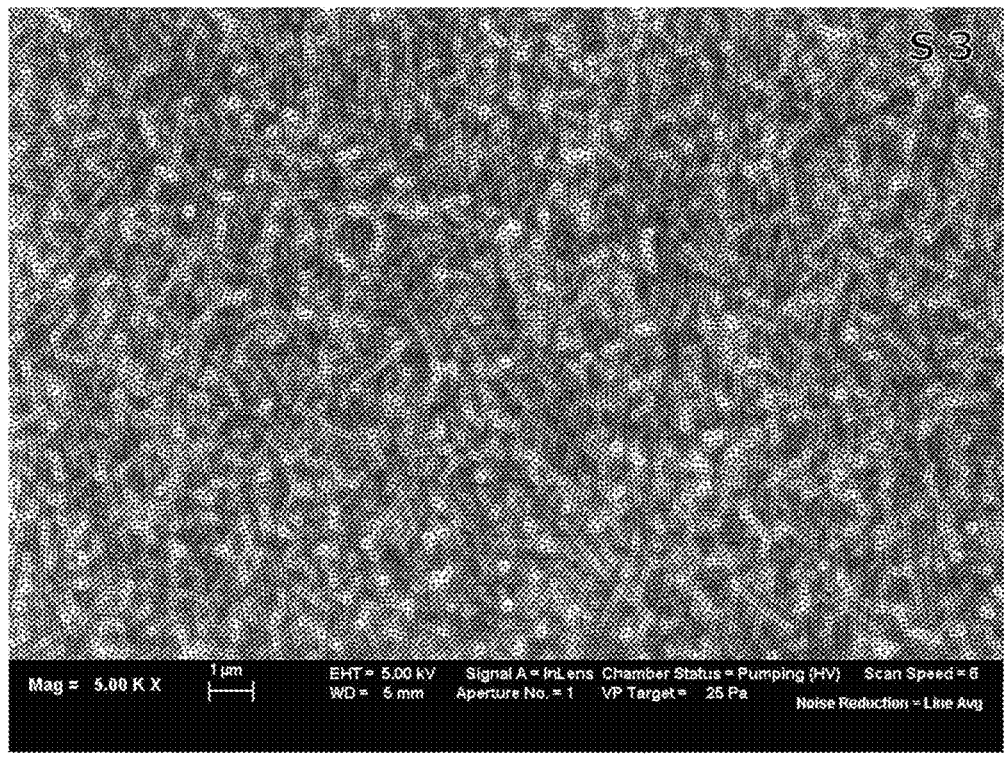
FIG. 8A shows a scanning electron microscope image (magnification: 5000×) of the $SiO_2$ nanoparticles having a diameter of 100 nm and arranged on the crystal face of the GaN-based semiconductor in embodiment 1.
Figure 8B:
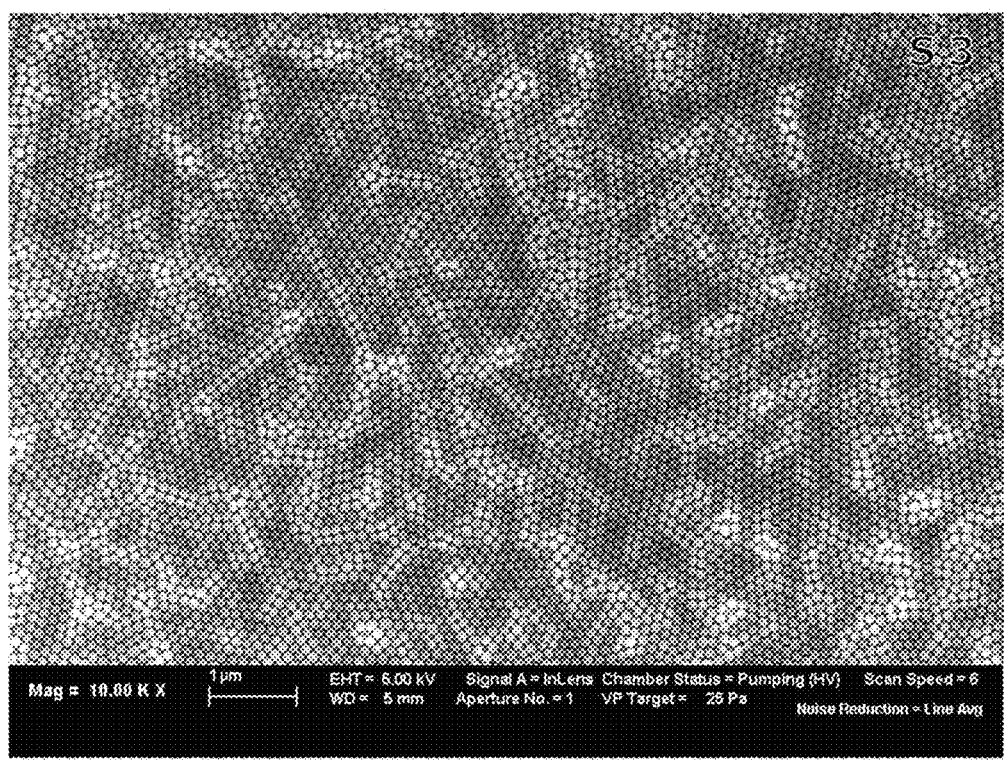
FIG. 8B is a magnified image of FIG. 8A (magnification: 10000×)
Figure 8C:
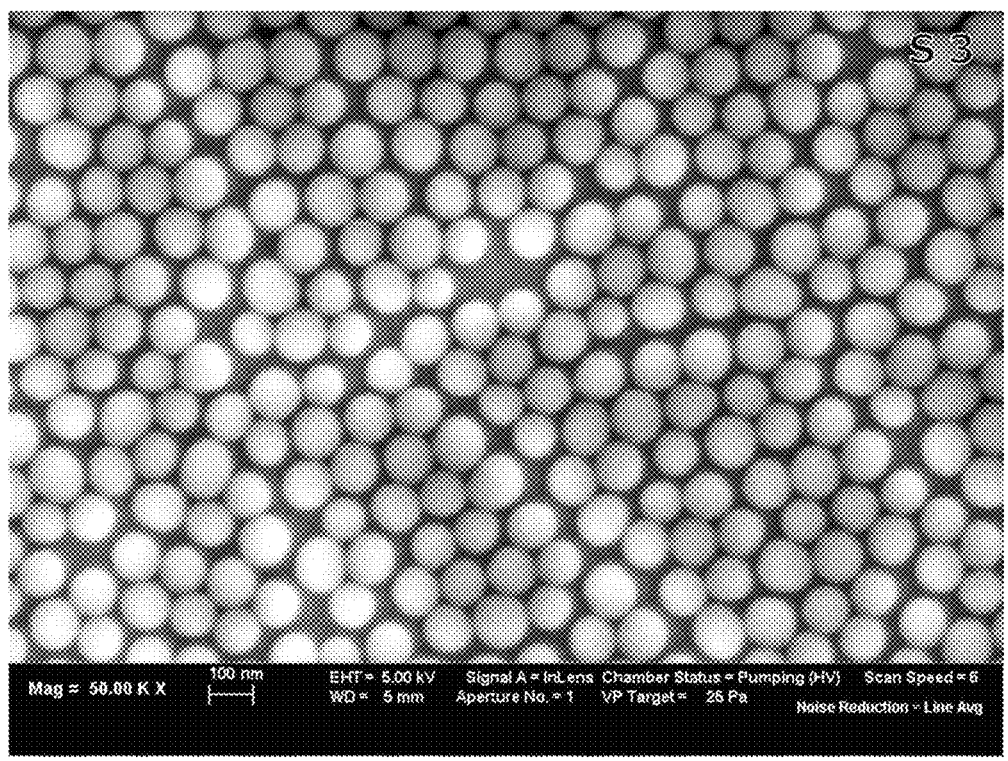
FIG. 8C is a magnified image of FIG. 8A (magnification: 50000×)
Figure 8D:
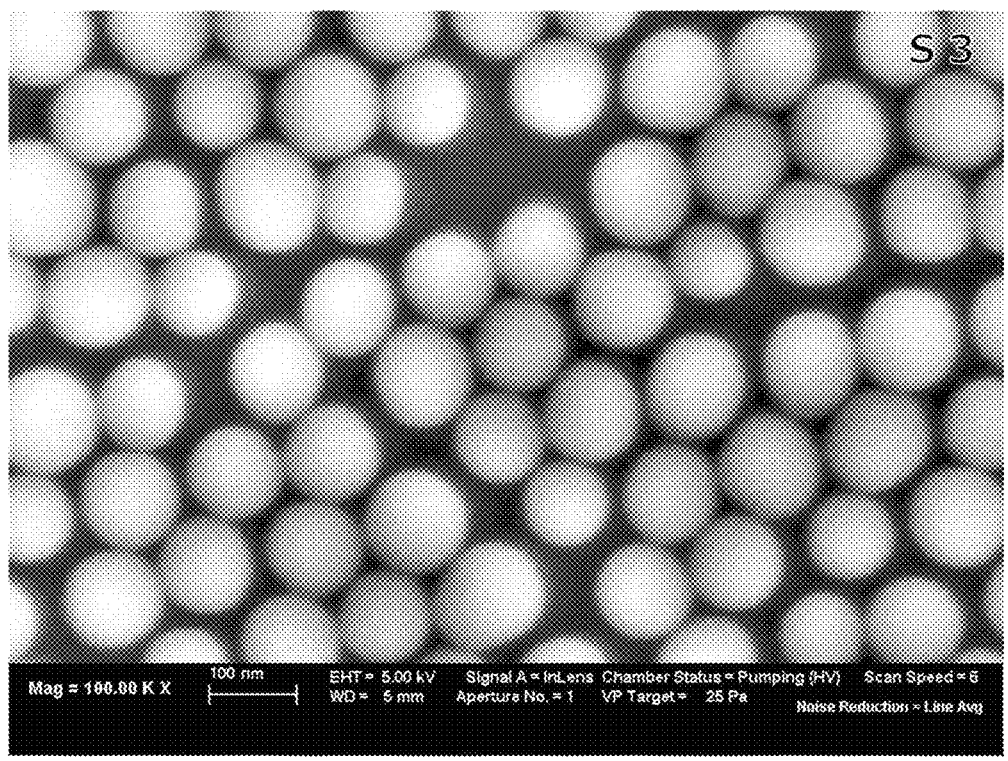
FIG. 8D is a magnified image of FIG. 8A (magnification: 100000×)
Figure 9A:
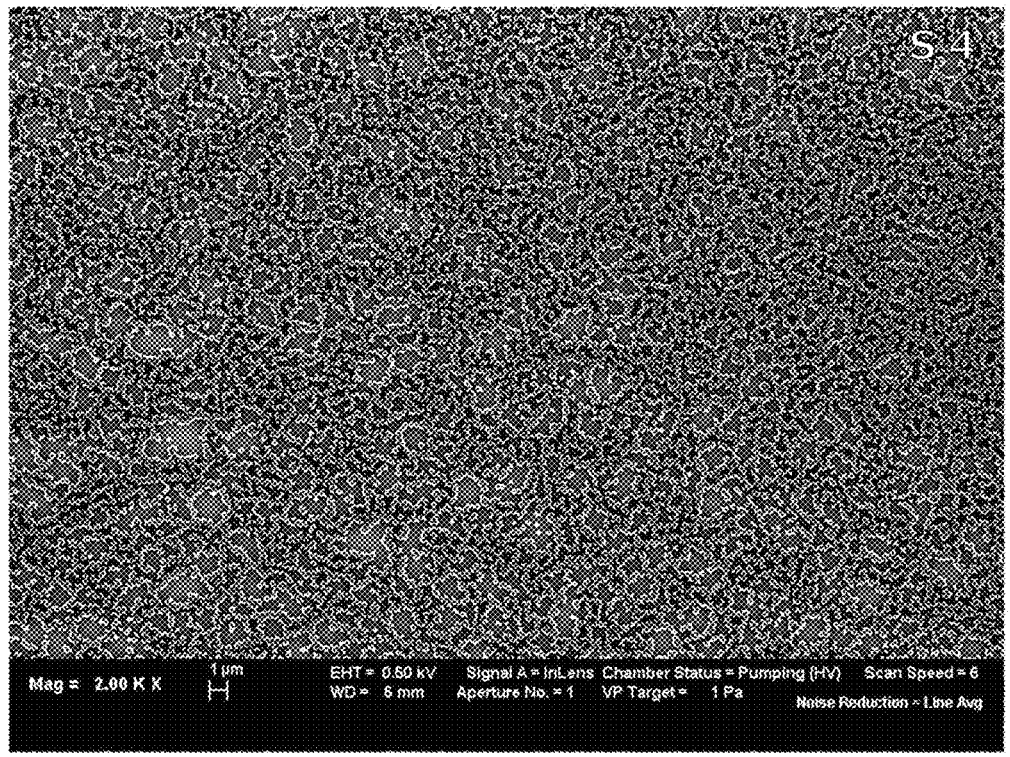
FIG. 9A is a scanning electron microscope image (magnification: 2000×, an image observed from directly above) of an irregular portion formed on the crystal face of the GaN-based semiconductor in embodiment 1.
Figure 9B:
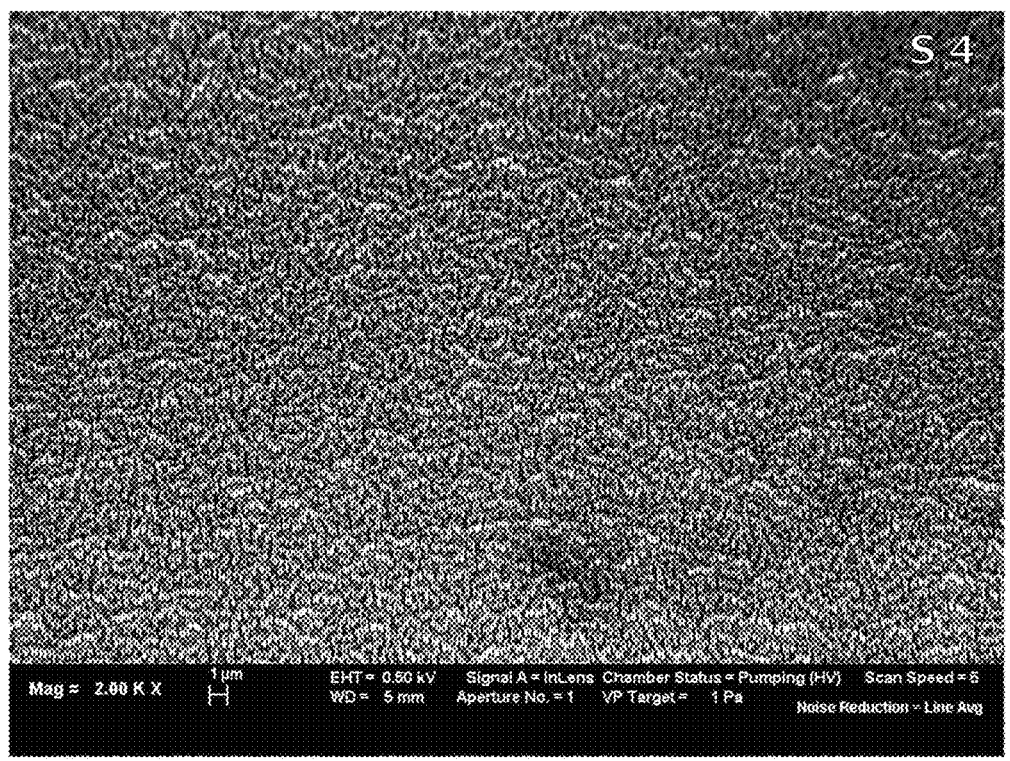
FIG. 9B is an image obtained by observing FIG. 9A at an oblique angle of 30°.
Figure 10A:
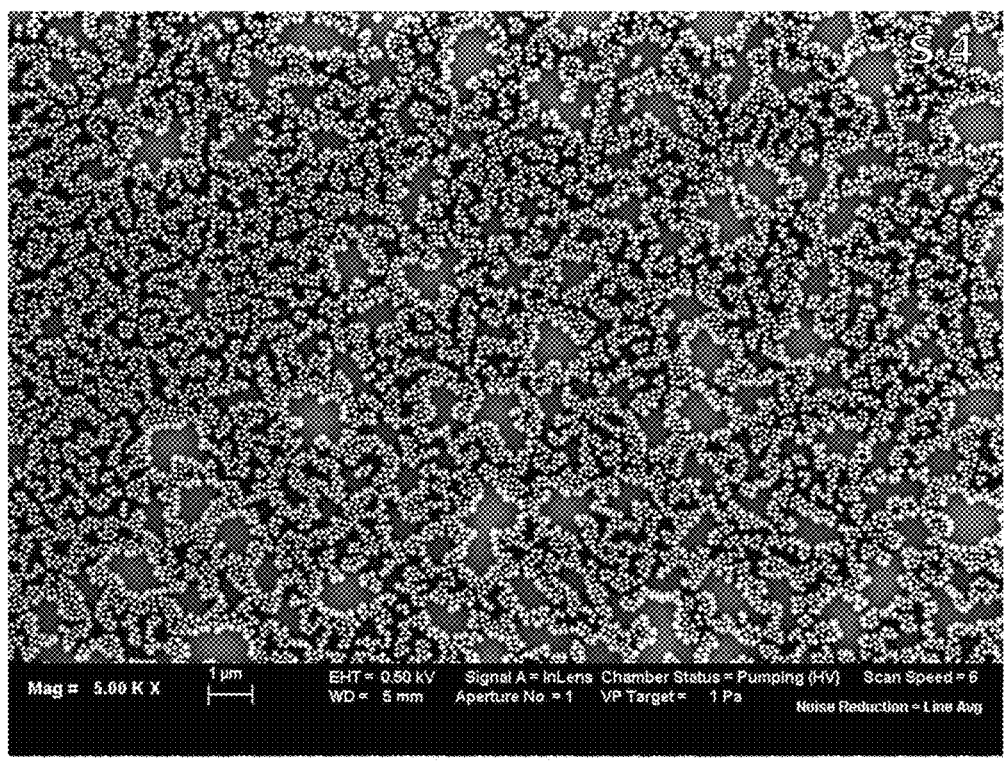
FIG. 10A is a magnified image (magnification: 5000×, an image observed from directly above) of FIG. 9A.
Figure 10B:
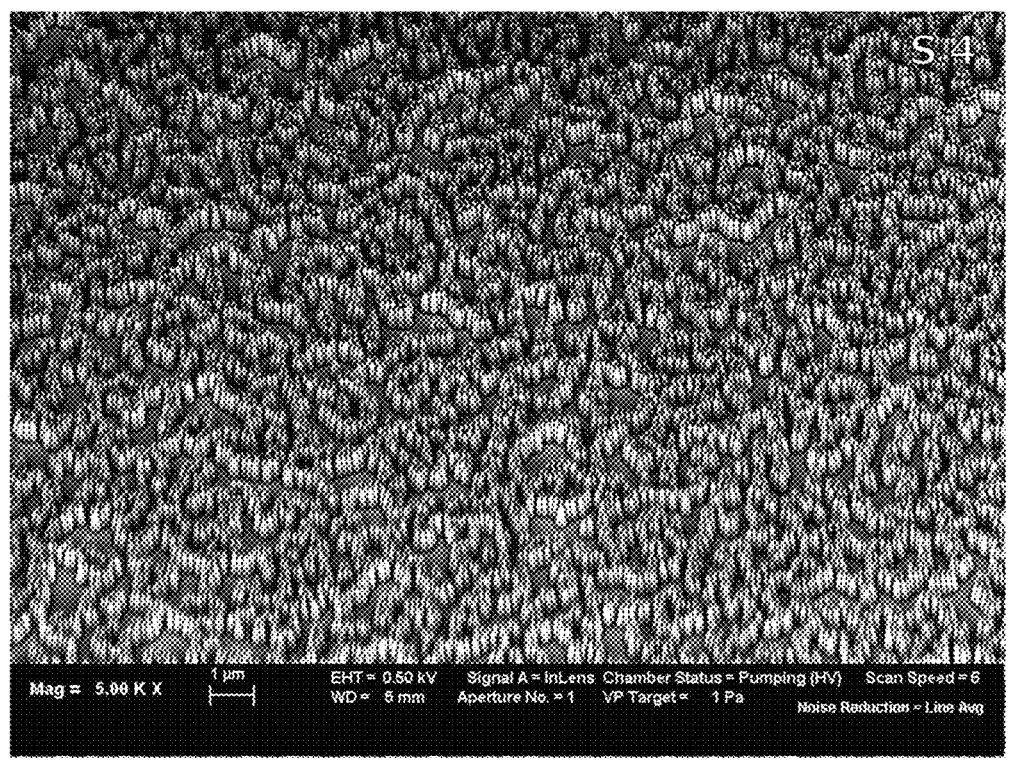
FIG. 10B is an image obtained by observing FIG. 10A at an oblique angle of 30°.
Figure 11A:
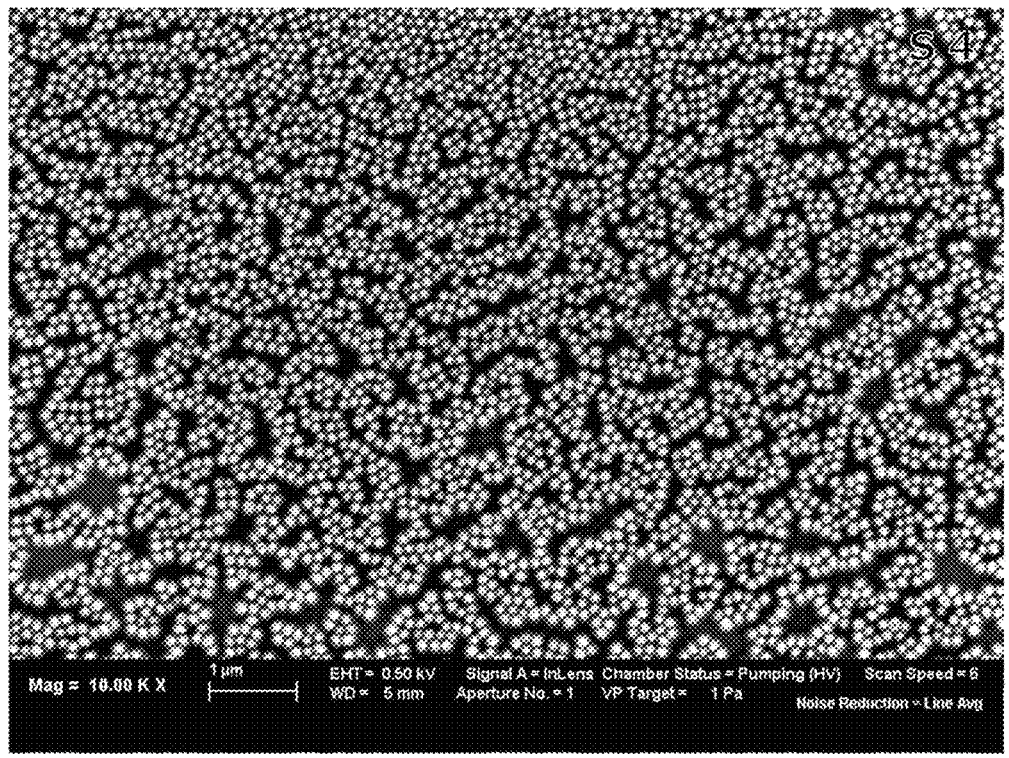
FIG. 11A is a magnified image (magnification: 10000×, an image observed from directly above) of FIG. 9A.
Figure 11B:
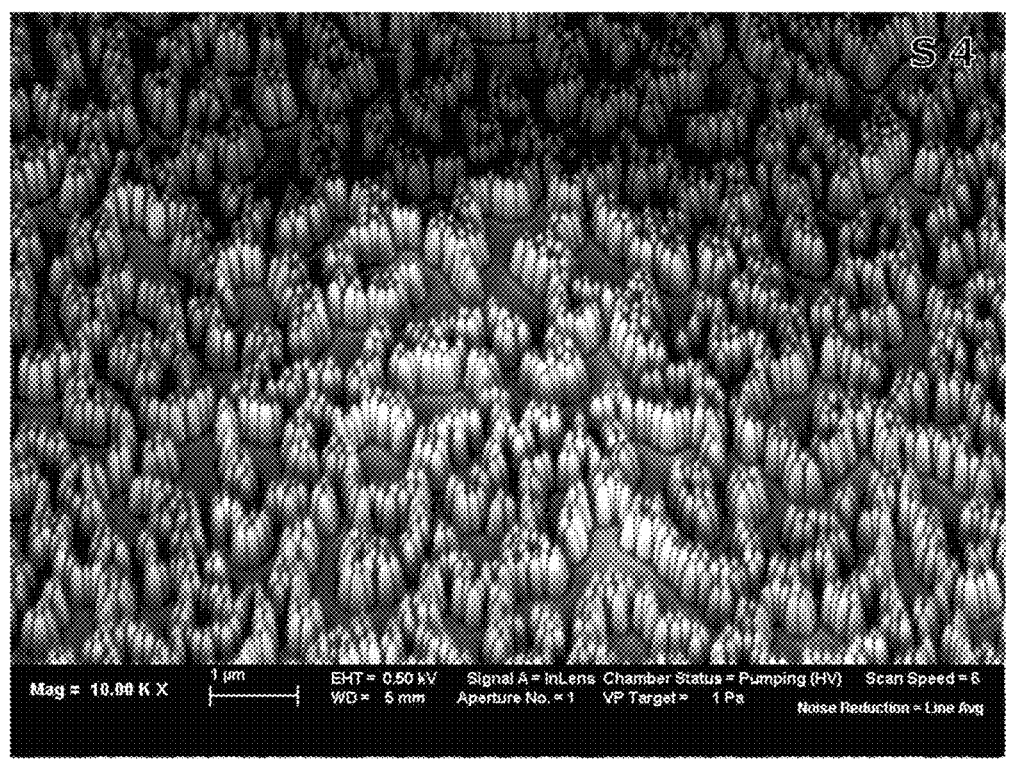
FIG. 11B is an image obtained by observing FIG. 11A at an oblique angle of 30°.
Figure 12A:
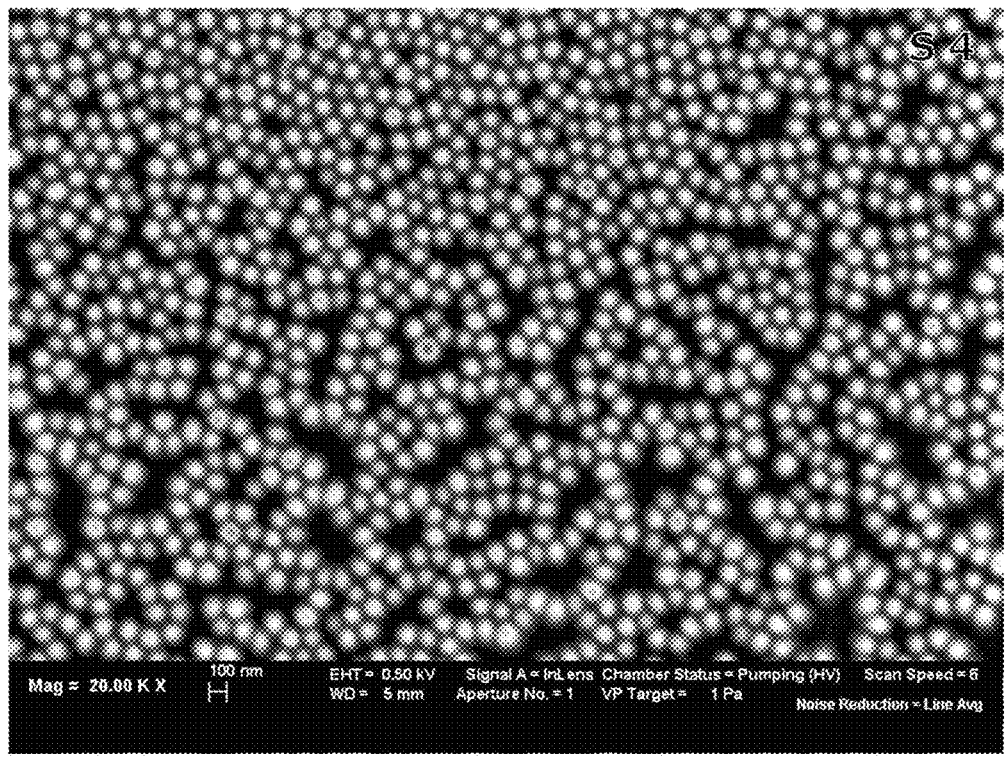
FIG. 12A is a magnified image (magnification: 20000×, an image observed from directly above) of FIG. 9A.
Figure 12B:
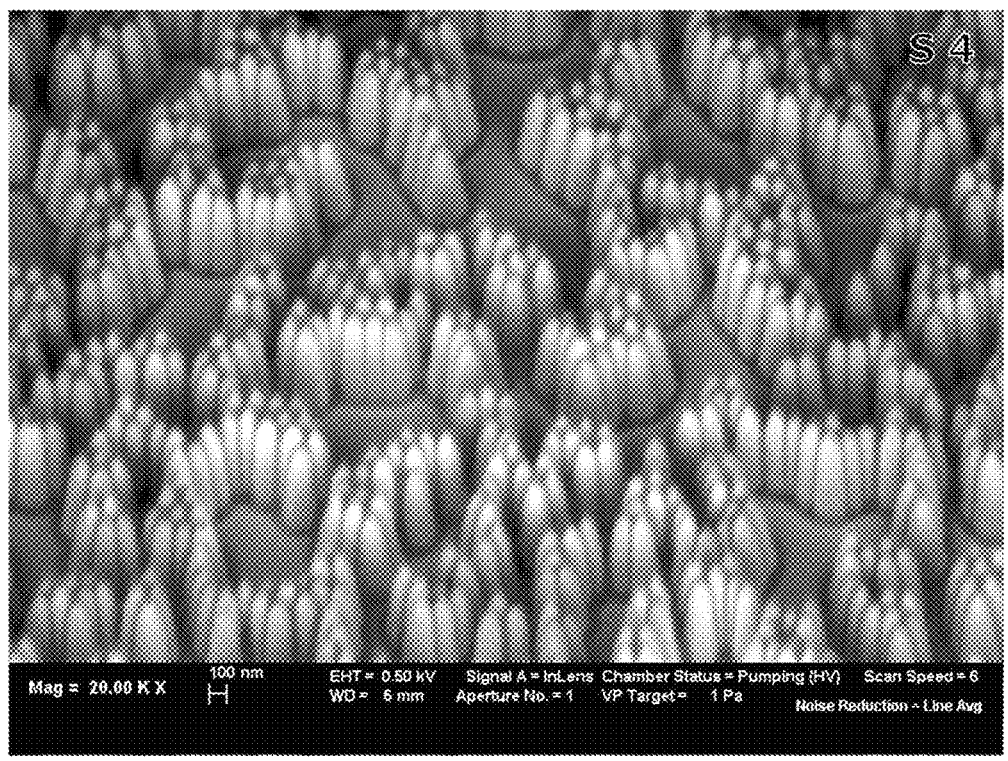
FIG. 12B is an image obtained by observing FIG. 12A at an oblique angle of 30°.

FIG. 7 shows an optical microscope image of $SiO_2$ nanoparticles having a diameter of 100 nm and arranged on the crystal face 12 of the GaN-based semiconductor 11. FIGS. 8A to 8D show scanning electron microscope images of the $SiO_2$ nanoparticles having a diameter of 100 nm and arranged on the crystal face 12 of the GaN-based semiconductor 11. FIGS. 9A to 12B show scanning electron microscope images of the irregular portion 15 formed on the crystal face 12 of the GaN-based semiconductor 11.

First, a GaN-based semiconductor 11 inclined 0.4° in the m-axis [10-10] direction with respect to the c-plane (0001) was prepared (step S0).

This GaN-based semiconductor 11 was subjected to ultrasonic cleaning with acetone for 3 minutes. Then the resulting GaN-based semiconductor 11 was subjected to ultrasonic cleaning with ethanol for 3 minutes. Then the resulting GaN-based semiconductor 11 was cleaned with pure water for 5 minutes. Then the resulting GaN-based semiconductor 11 was dried using a $N_2$ gas blower. The GaN-based semiconductor 11 was subjected to organic solvent cleaning in the manner described above (step S1).

Next, the GaN-based semiconductor 11 subjected to the organic solvent cleaning was irradiated with ultraviolet light for 15 minutes (step S2). The wavelength of the ultraviolet light was 254 nm. The GaN-based semiconductor 11 having the crystal face 12 modified through the organic solvent cleaning and the ultraviolet irradiation was thereby produced.

Colloidal particles 71 were arranged on the surface-modified GaN-based semiconductor 11 by applying a self-ordering process of a colloidal solution using a dip coating method (step S3) to thereby form a colloidal crystal film of the $SiO_2$ nanoparticles having a diameter of 100 nm. Fine spherical silica particles (KE-W10) manufactured by NIP- PON SHOKUBAI Co., Ltd. were used for the colloidal solution, and a 1.0 wt % aqueous solution was prepared. The dip coating rate was 5.6 μm/s.

The results of optical microscope observation of the colloidal crystal film on the surface-modified GaN-based semiconductor 11 are shown in FIG. 7. As can be found from FIG. 7, although the fine structure of the particles with a diameter of 100 nm is not observed under the optical microscope at a magnification of 1,000×, no noticeable defects are observed. Although FIG. 7 shows a monochrome image, the original image is a color image. It was found that, since a brown structural color was observed, a good colloidal crystal film was formed.

Next, the results of scanning electron microscope observation of the colloidal crystal film are shown in FIGS. 8A to 8D. As can be found from FIGS. 8A to 8D, the nanoparticles with a diameter of 100 nm were formed into a large-area film with a monolayer thickness so as to form a close-packed structure.

Next, the GaN-based semiconductor 11 on which the colloidal particles 71 were arranged was subjected to dry etching using the $SiO_2$ nanoparticles as an etching mask (step S4). An etching apparatus (RIE-101iHS) manufactured by Samco Inc. was used for the dry etching. The treatment was performed under the conditions of an ICP power of 150 W, a bias power of 50 W, a chlorine flow rate of 10 sccm, a pressure of 0.5 Pa, and a treatment time of 1 minute. The ratio of the etching rate of $SiO_2$ to the etching rate of GaN under the above conditions was 1:8. When, for example, $SiO_2$ is etched 100 nm, GaN is etched 800 nm.

The results of scanning electron microscope observation of the thus-formed nanometer-scale irregular portion 15 are shown in FIGS. 9A to 12B.

Since the etching was performed using, as a mask, the monolayer close-packed colloidal crystal of the $SiO_2$ nanoparticles having a diameter of 100 nm, the irregular portion 15 of the GaN-based semiconductor 11 was formed as rod-shaped bodies having a diameter of 100 nm and a shortest apex-to-apex distance of 100 nm. The height of the observed rod-shaped bodies was 800 nm, and the shortest gap (valley size) between peaks (convex sections) was 10 nm. The surface roughness of the irregular portion 15 of the GaN-based semiconductor 11 was measured using a laser microscope and found to be RSm=62.652 μm.

The irregular portion 15 has a moth eye structure and is composed of a plurality of rod-shaped bodies erected on the crystal face 12 as shown in FIGS. 9A to 12B. The aspect ratio of each of the plurality of rod-shaped bodies can be appropriately selected within the range of from 2 to 10 inclusive. The aspect ratio of each rod-shaped body may be from 7 to 9 inclusive.

Next, the GaN-based semiconductor 11 on which the irregular portion 15 was formed was subjected to ultrasonic cleaning with acetone for 3 minutes. Next, the resulting GaN-based semiconductor 11 was subjected to ultrasonic cleaning with ethanol for 3 minutes. Then the resulting GaN-based semiconductor 11 was cleaned with pure water for 5 minutes. Then the resulting GaN-based semiconductor 11 was dried using a $N_2$ gas blower. The GaN-based semiconductor 11 was subjected to organic solvent cleaning in the manner described above (step S5).

Next, the GaN-based semiconductor 11 subjected to the organic solvent cleaning was irradiated with ultraviolet light for 15 minutes (step S6). The wavelength of the ultraviolet light was 254 nm. The device 1, i.e., the GaN-based semiconductor device with the surface 15a of the irregular portion 15 modified through the organic solvent cleaning and the ultraviolet irradiation, was thereby produced.

For each of the device 1 formed through steps S0 to S6 shown in FIG. 4C and including the irregular portion 15 having a superhydrophilic surface and an untreated GaN-based semiconductor 11 in step S0, their ability to collect water vapor in air to thereby obtain water droplets was evaluated.

Figure 13A:
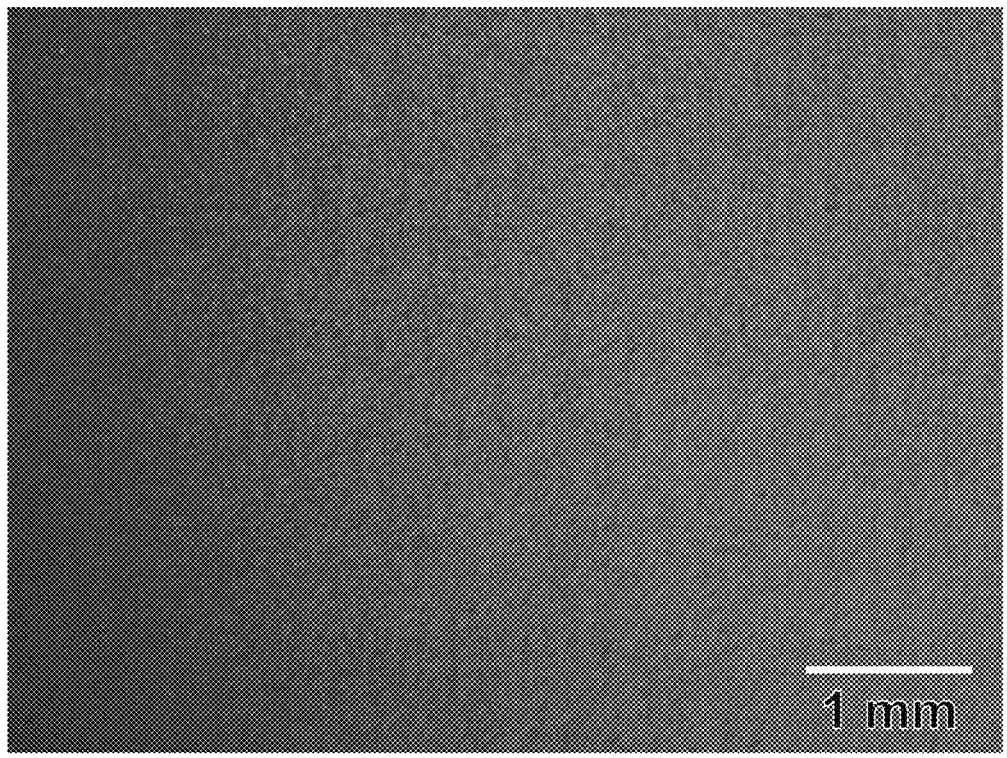
FIG. 13A is a photograph showing the results of evaluation of the ability of the crystal face of an untreated GaN-based semiconductor to collect water vapor in air to obtain water droplets (Comparative Example)
Figure 13B:
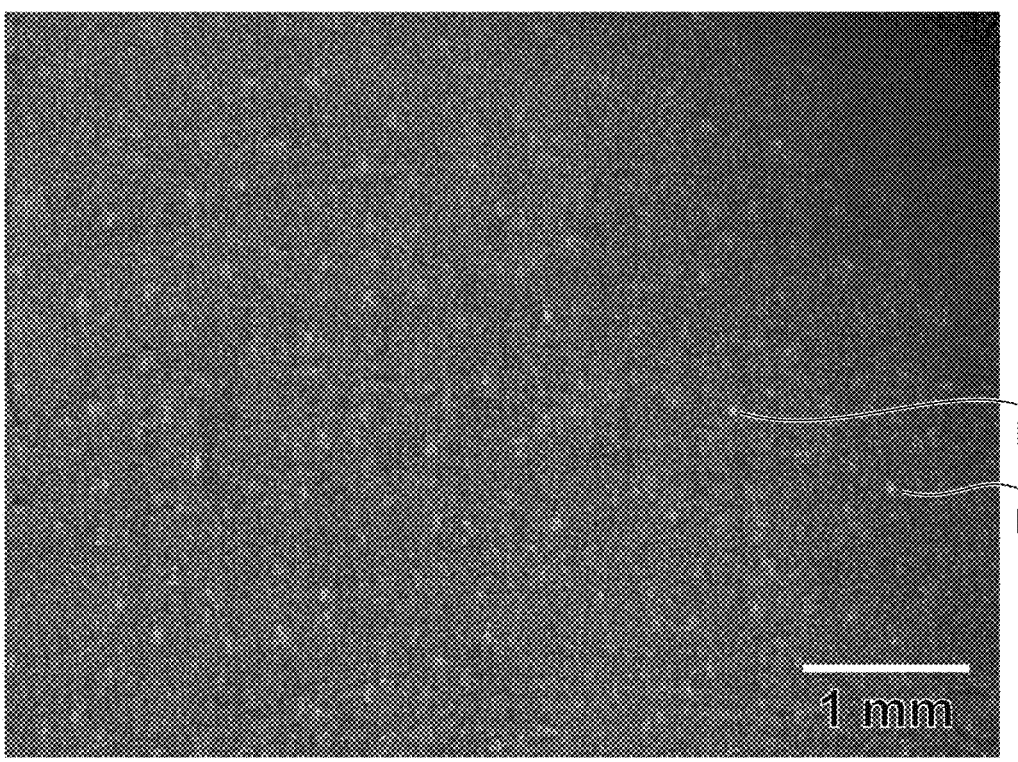
FIG. 13B is a photograph showing the results of evaluation of the ability of the crystal face of a device in embodiment 1 to collect water vapor in air to obtain water droplets.

FIG. 13A is a photograph showing the results of ability evaluation performed on the untreated GaN-based semiconductor 11. FIG. 13B is a photograph showing the results of ability evaluation performed on the crystal face of the device 1 in embodiment 1.

The evaluation test was performed in a substantially calm state. Specifically, the evaluation test was performed in a constant temperature and humidity bath produced by modifying a desiccator. The environment inside the constant temperature and humidity bath was held at 27° C. and 85% RH. The above two types of GaN-based semiconductors 11 were placed on a sample stage equipped with a Peltier module driven at a constant temperature of 27° C., and only the sample stage equipped with the Peltier module was cooled to 20° C. Then the surfaces of the two types of GaN-based semiconductors 11 were observed under a microscope after a lapse of one minute at which the temperature of the samples was still decreasing.

A large number of water droplets with a diameter of about 10 μm were found over the entire principal surface 11a of the GaN-based semiconductor 11 of the device 1 shown in FIG. 13B. However, no water droplets were found on the surface of the untreated GaN-based semiconductor 11 shown in FIG. 13A, although they were exposed to the same environment. As can be seen from the above results, the device 1 in the present embodiment is excellent in ability to collect water vapor in air and in ability to form the water vapor into large water droplets.

Example 3

Example 3 will be described with reference to FIGS. 14 to 20. In Example 3, a small volume of water was dropped onto a specimen such as a GaN-based semiconductor 11, and then the specimen was inclined to check whether or not the water slid down. When water can slide down even though the volume of the water droplet is small, the water trapped by the device 1 etc. can be efficiently collected.

Figure 14:
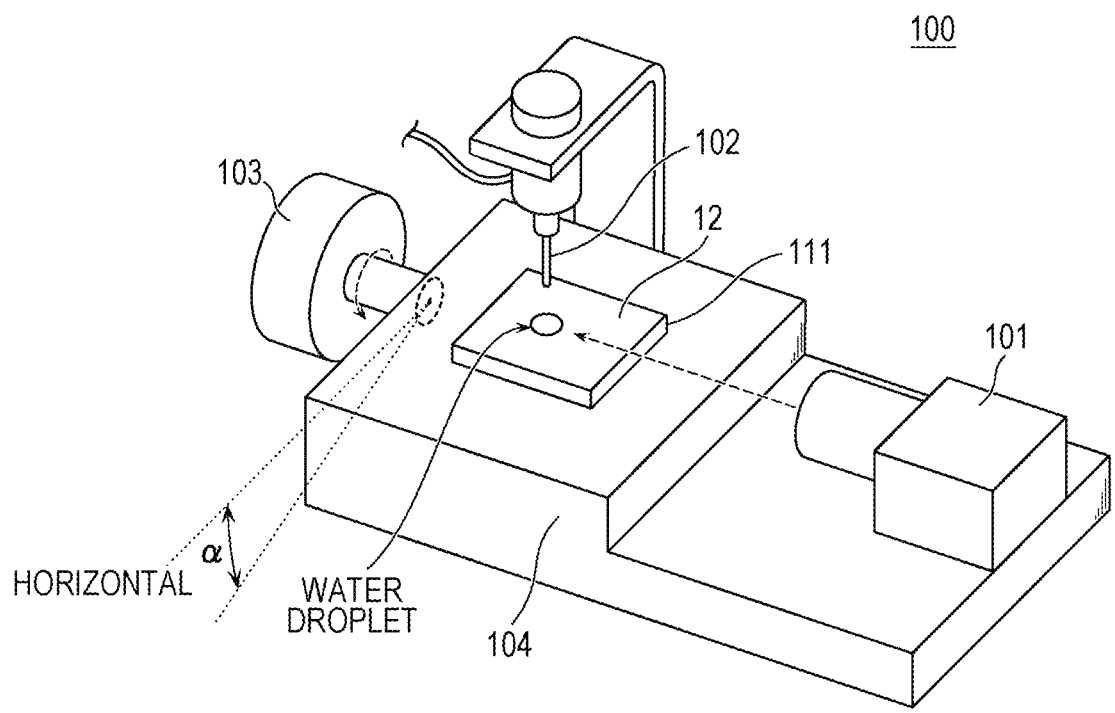
FIG. 14 is a schematic illustration of a testing apparatus for taking images showing how water dropped onto a specimen such as a GaN-based semiconductor slides down.

FIG. 14 is a schematic illustration of a testing apparatus 100 for taking images showing how water dropped onto the specimen 111 slides down.

The testing apparatus 100 includes a base 104 to which the specimen 111 such as the GaN-based semiconductor 11 is fixed, a water supply unit 102 that drops water onto the specimen 111, an angle adjuster 103 that inclines the specimen 111, and a camera 101 that takes images of water sliding down.

The water supply unit 102 is an injector that supplies a prescribed volume of pure water. The water supply unit 102 is disposed above the specimen 111 and fixed to the base 104. The water supply unit 102 can be used to supply, for example, a water droplet of 1 μL to 70 μL to the specimen 111. The angle adjuster 103 is connected to the base 104 and rotates the base 104. The specimen 111 rotates together with the base 104 and is inclined at a prescribed angle with respect to the horizontal. As the specimen 111 is rotated, the water droplet on the specimen 111 slides down the specimen 111. The camera 101 takes images of the water droplet sliding down the specimen 111. The camera 101 is fixed to the base 104 and is configured to rotate integrally with the base 104. The inclination angle of the specimen 111 with respect to the horizontal when the water droplet starts sliding down is referred to as a sliding angle α.

The specimen 111 of the present Example was a GaN substrate having a surface-modified irregular portion (corresponding to the GaN substrate after step S6). Specifically, the specimen 111 of the present Example was a GaN-based semiconductor device having a superhydrophilic crystal face 12 inclined from 0.05° to 15° inclusive with respect to the c-plane and having an irregular portion 15 on the crystal face 12. A specimen 111 used as a Comparative Example was a GaN substrate modified in step S2.

Figure 15A:
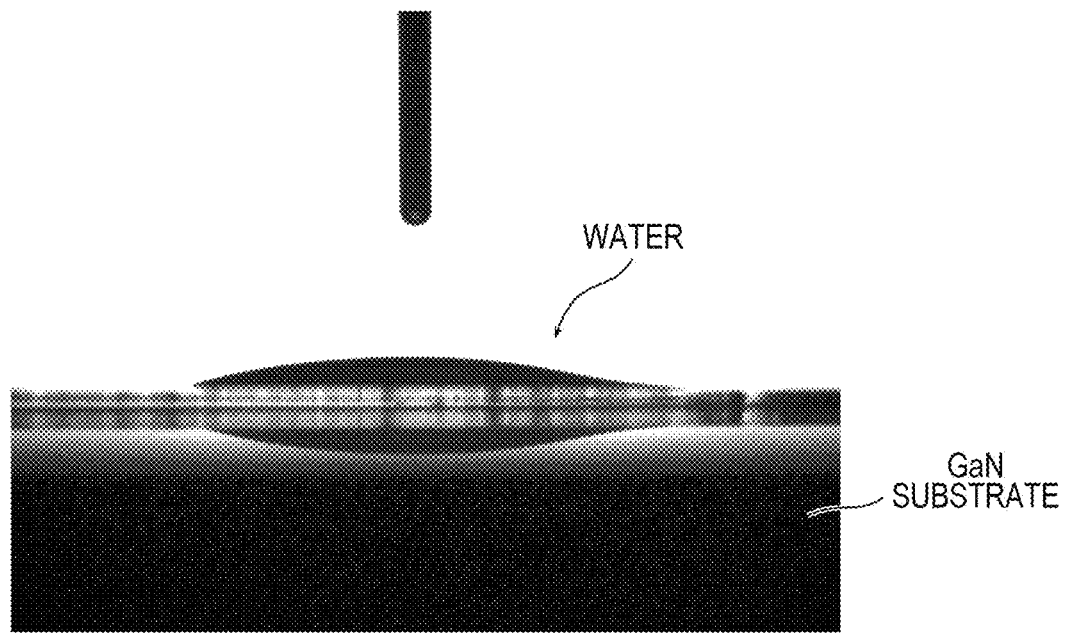
FIG. 15A is a photograph obtained by dropping 20 μL of water onto a GaN substrate modified in S2 and observing the water from the side (Comparative Example)
Figure 15B:
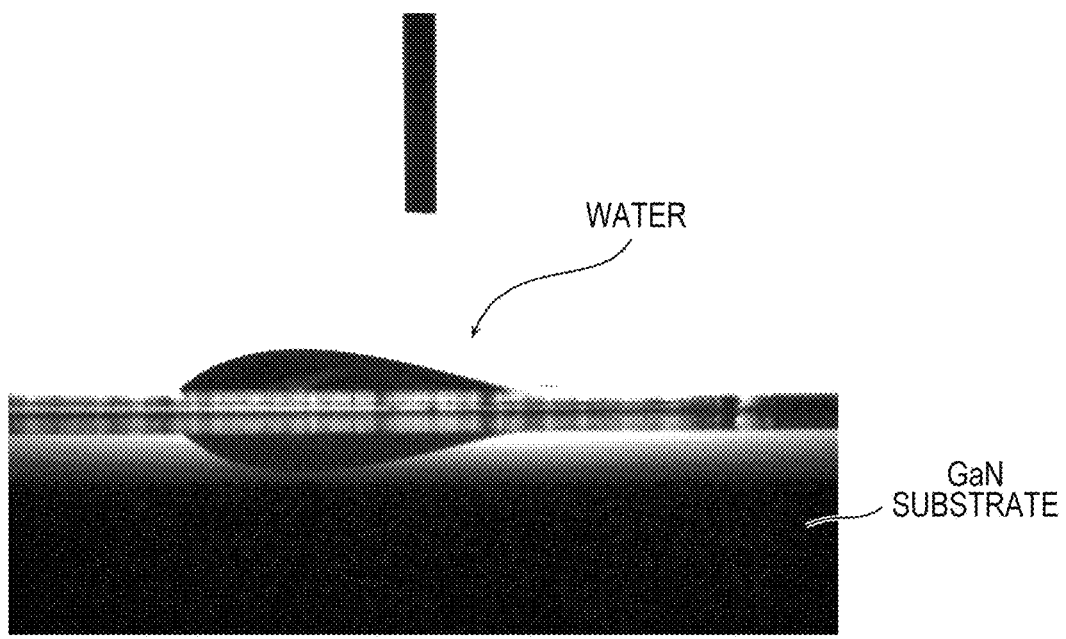
FIG. 15B is a photograph showing the observed behavior of the water sliding down when the GaN substrate in FIG. 15A was inclined 45° (Comparative Example)
Figure 16A:
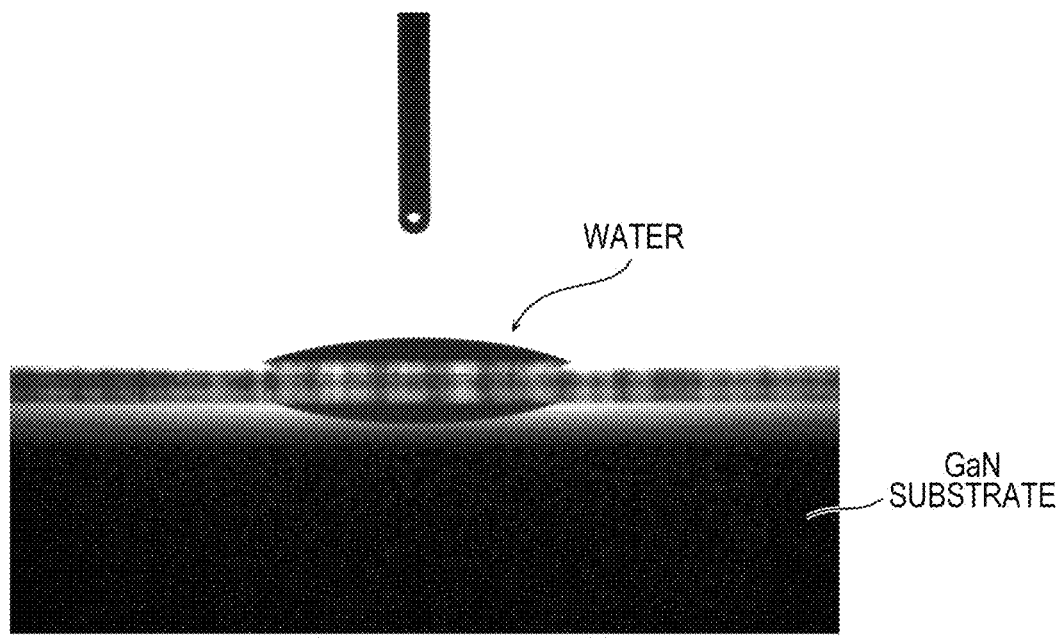
FIG. 16A is a photograph obtained by dropping 10 μL of water onto the GaN substrate modified in S2 and observing the water from the side (Comparative Example)
Figure 16B:
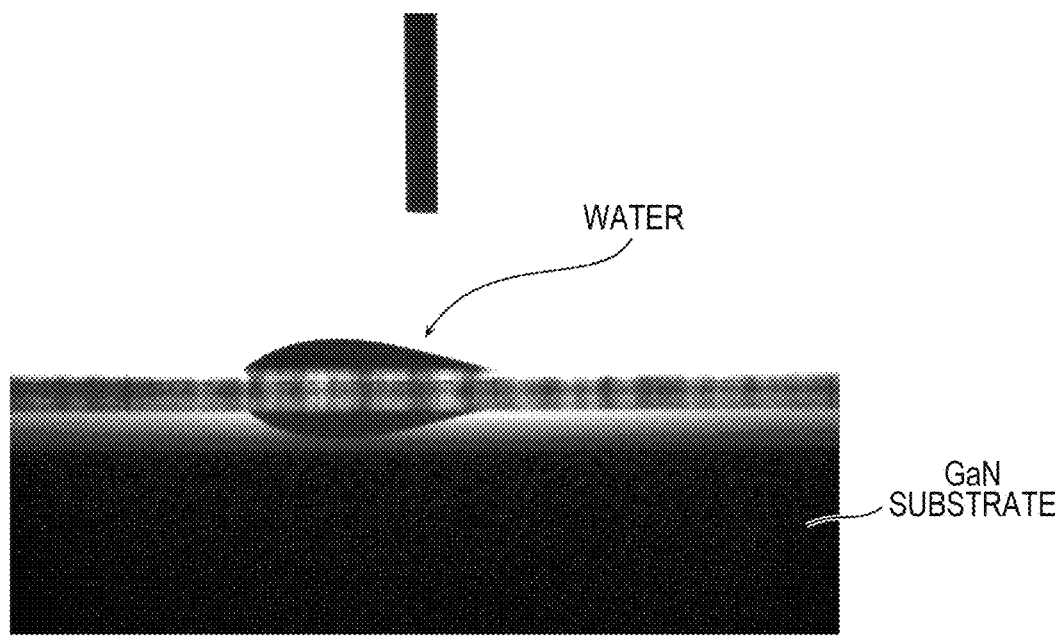
FIG. 16B is a photograph showing the water under observation when the GaN substrate in FIG. 16A was inclined 90° (Comparative Example)

Referring first to FIGS. 15A to 16B, the volume of water on the GaN substrate modified in step S2 (the Comparative Example) and the sliding angle α will be described. FIG. 15A is a photograph taken when 20 μL of water was dropped onto the GaN substrate modified in step S2 and the water was observed from the side, and FIG. 15B is a photograph showing the observed behavior of the water sliding down when the GaN substrate in FIG. 15A was inclined 45°. FIG. 16A is a photograph taken when 10 μL of water was dropped onto the GaN substrate modified in step S2 and the water was observed from the side, and FIG. 16B is a photograph showing the water when the GaN substrate was inclined 90°.

As can be seen from FIGS. 15A and 15B, to allow 20 μL of water to slide down, it is necessary that the GaN substrate modified in step S2 be inclined 45°. As shown in FIGS. 16A and 16B, even when the GaN substrate was inclined 90° in order to cause the water with a volume of 10 μL to slide down, the water did not slide down. As can be seen from these figures, it is difficult to allow water with a volume of 10 μL or less to slide down the GaN substrate modified in step S2.

Figure 17A:
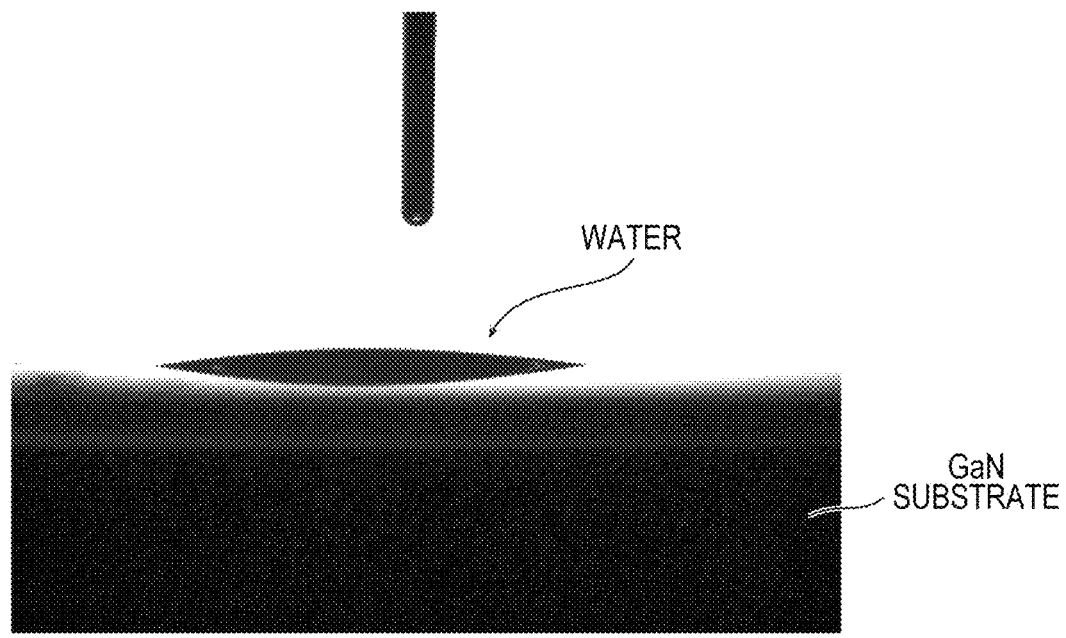
FIG. 17A is a photograph obtained by dropping 10 μL of water onto a GaN substrate having a modified irregular surface and observing the water from the side.
Figure 19A:
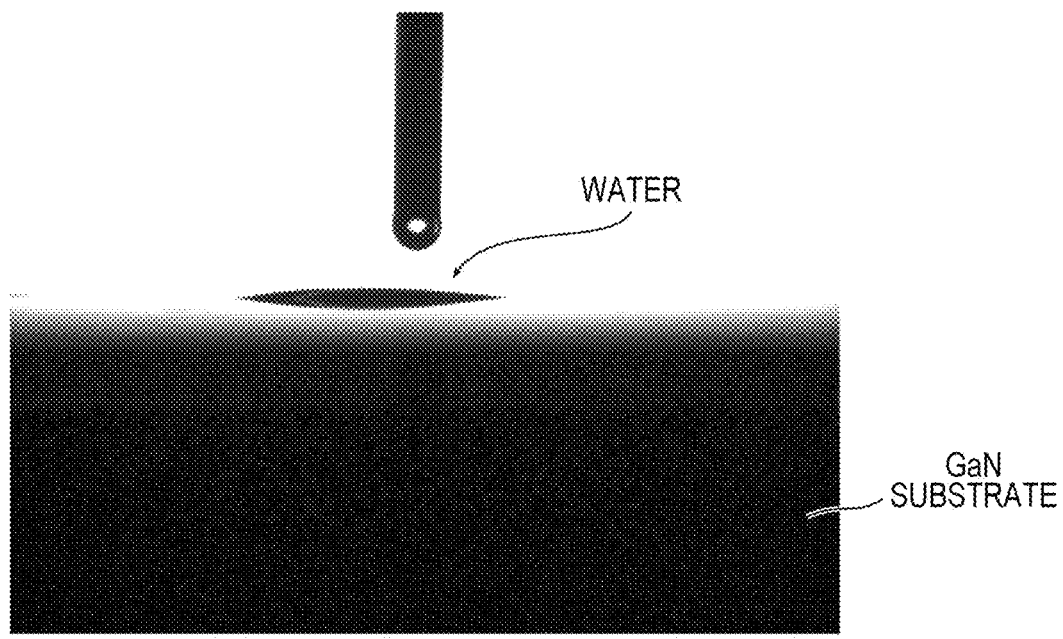
FIG. 19A is a photograph obtained by dropping 1 μL of water onto the GaN substrate having the modified irregular surface and observing the water from the side.
Figure 19B:
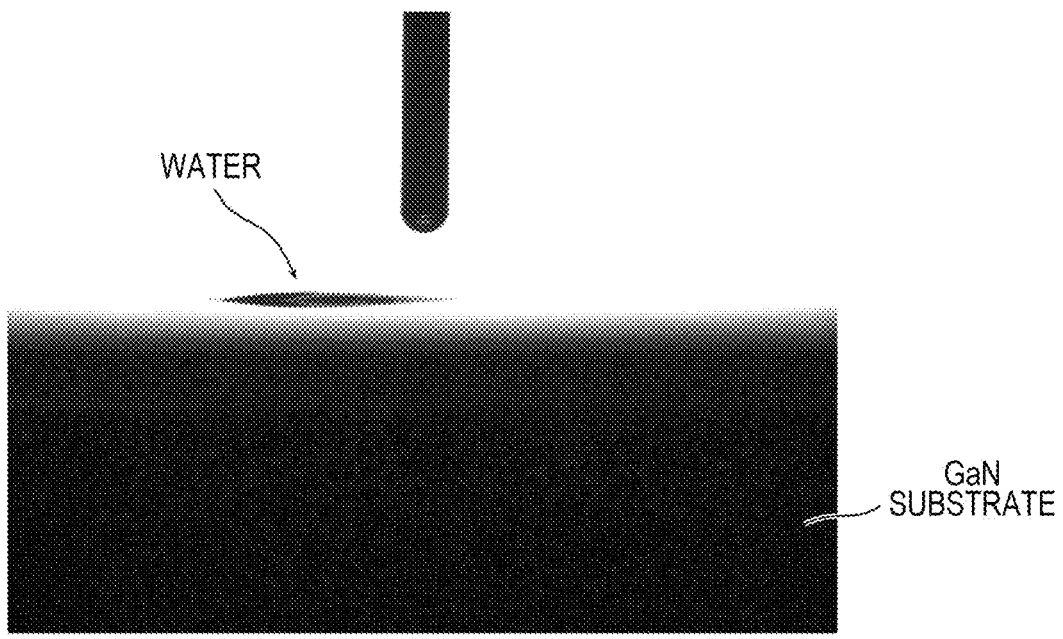
FIG. 19B is a photograph showing the observed behavior of the water sliding down when the GaN substrate in FIG. 19A was inclined 36°.

Referring next to FIGS. 17A to 19B, the volume of water on the GaN substrate having the surface-modified irregular portion (corresponding to the GaN substrate after step S6) and the sliding angle α will be described. FIG. 17A is a photograph taken when 10 μL of water was dropped onto the GaN substrate having the surface-modified irregular portion and the water was observed from the side, and FIG. 17B is a photograph showing the observed behavior of the water sliding down when the GaN substrate in FIG. 17A was inclined 3°. FIG. 18A is a photograph taken when 3 μL of water was dropped onto the GaN substrate having the surface-modified irregular portion and the water was observed from the side, and FIG. 18B is a photograph showing the observed behavior of the water sliding down when the GaN substrate in FIG. 18A was inclined 4°. FIG. 19A is a photograph taken when 1 μL of water was dropped onto the GaN substrate having the surface-modified irregular portion and the water was observed from the side, and FIG. 19B is a photograph showing the observed behavior of the water sliding down when the GaN substrate in FIG. 19A was inclined 36°.

Figure 17B:
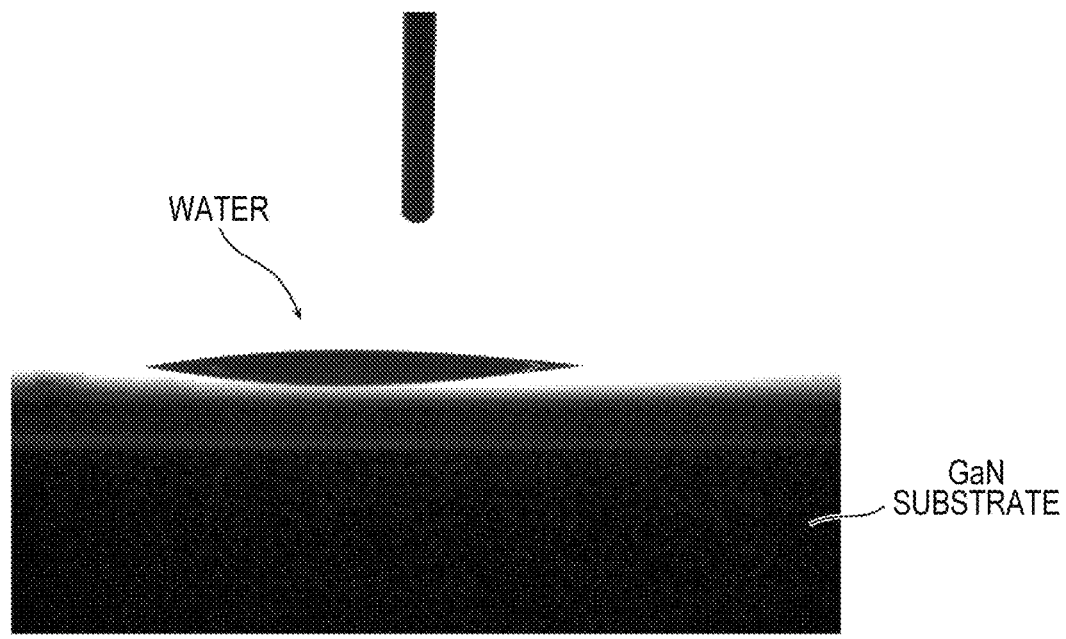
FIG. 17B is a photograph showing the observed behavior of the water sliding down when the GaN substrate in FIG. 17A was inclined 3°.
Figure 18A:
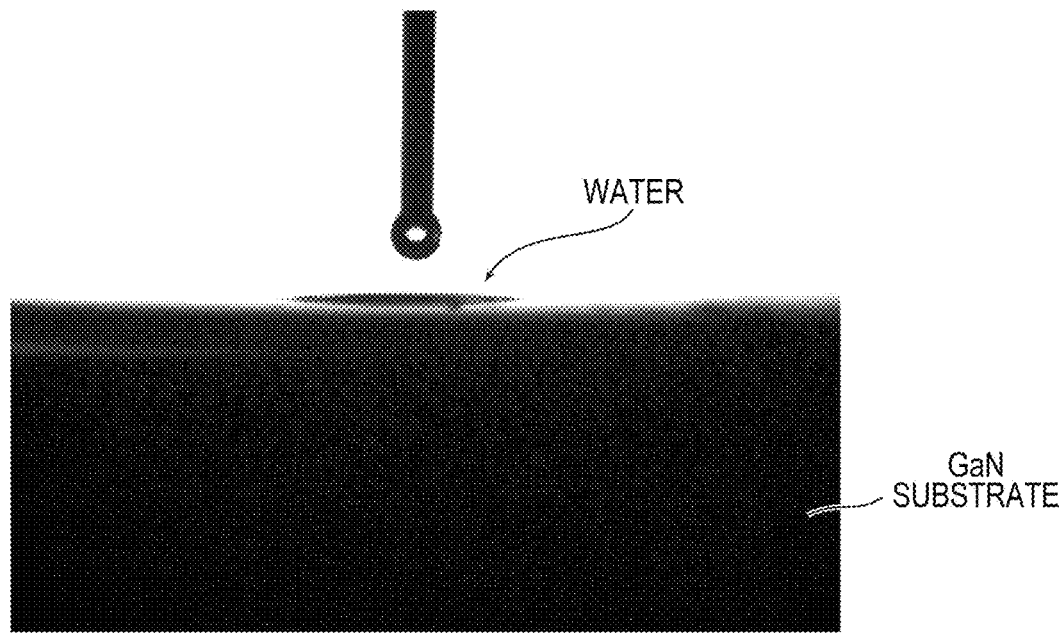
FIG. 18A is a photograph obtained by dropping 3 μL of water onto the GaN substrate having the modified irregular surface and observing the water from the side.
Figure 18B:
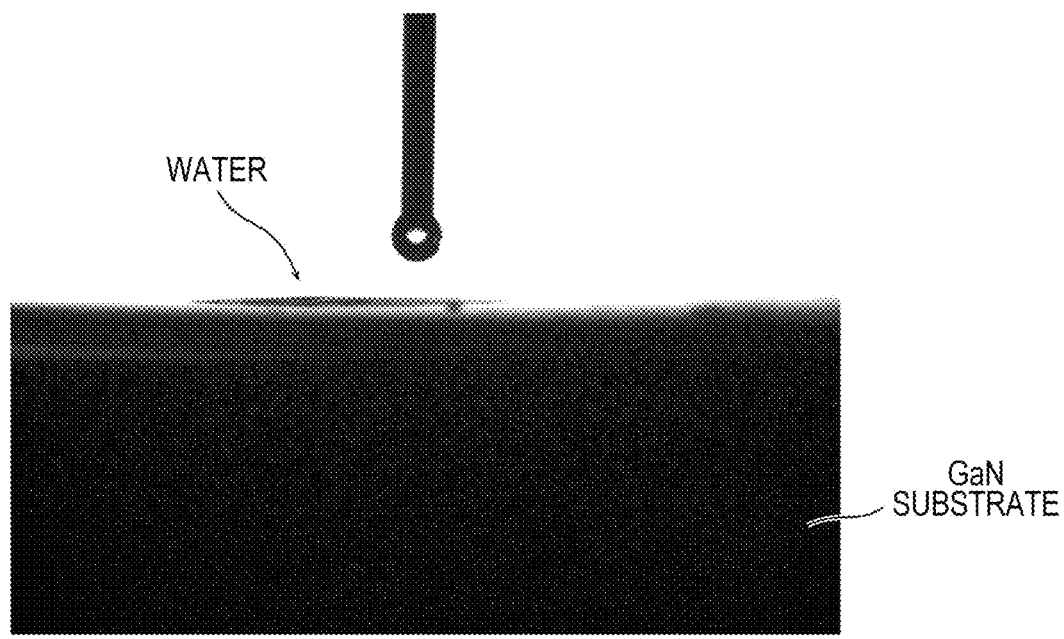
FIG. 18B is a photograph showing the observed behavior of the water sliding down when the GaN substrate in FIG. 18A was inclined 4°.

As can be seen from FIGS. 17A and 17B, 10 μL of water is allowed to slide down when the GaN substrate with the surface-modified irregular portion is inclined 3°. As can be seen from FIGS. 18A and 18B, 3 μL of water is allowed to slide down when the GaN substrate with the surface-modified irregular portion is inclined 4°. As can be seen from FIGS. 19A and 19B, 1 μL of water is allowed to slide down when the GaN substrate with the surface-modified irregular portion is inclined 36°. Specifically, the GaN substrate with the surface-modified irregular portion (corresponding to the GaN substrate after step S6) allows water with a small volume of 10 μL or less to slide down at a small sliding angle α of 4° or less and also allows water with a very small volume of 1 μL to slide down when the GaN substrate is inclined 36°.

Figure 20:
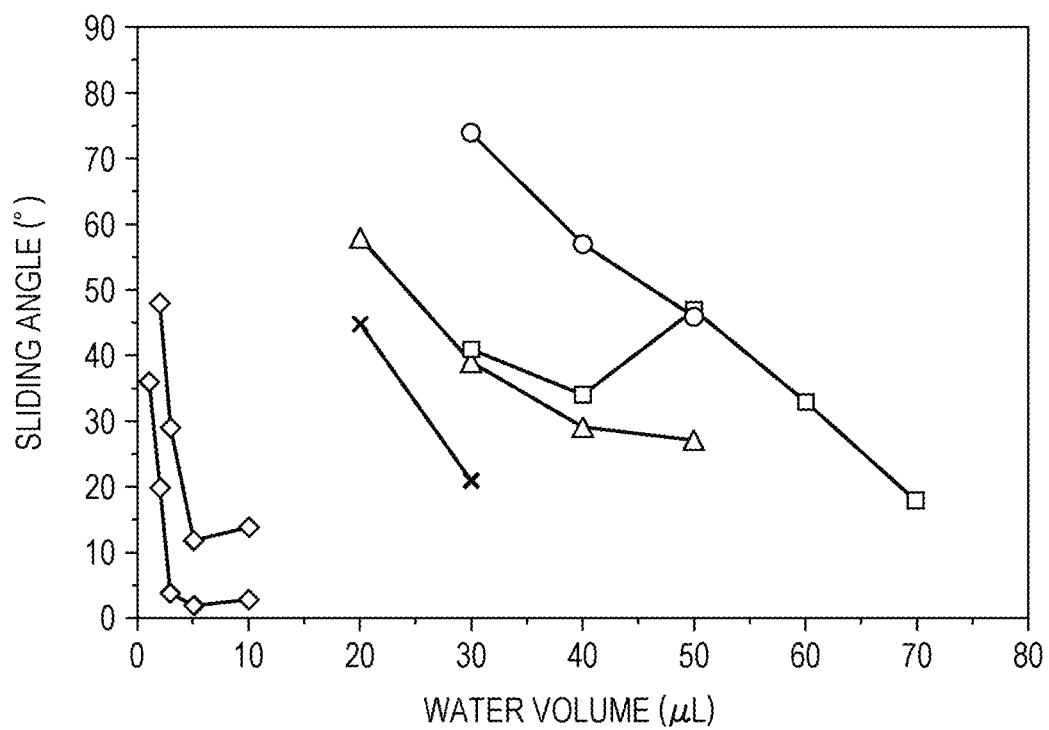
FIG. 20 is a graph showing the relation between the volume of water dropped onto a specimen such as a GaN-based semiconductor and a sliding angle.

The above-described observation of the relation between the volume of water and sliding down was made on a plurality of specimens. FIG. 20 is a graph showing the relation between the volume of water and the sliding angle for each of the plurality of specimens 111.

The specimen 111 of the present Example was the GaN substrate with the surface-modified irregular portion (corresponding to the GaN substrate after step S6), as in the above case. Specimens 111 used as Comparative Examples were the GaN substrate modified in step S2, a GaN substrate with a non-surface-modified irregular portion (corresponding to a GaN substrate after step S4), a glass slide, and a GaN substrate with a hydrophobic coating. The contact angle on the GaN substrate with the surface-modified irregular portion was 4.7°, and the contact angle on the GaN substrate modified in step S2 was 4.2°. The contact angle on the GaN substrate with the non-surface-modified irregular portion was 118°, and the contact angle on the glass slide was 33°. The contact angle on the GaN substrate with the hydrophobic coating was 112°. In FIG. 20, the results for the GaN substrate with the surface-modified irregular portion are represented by diamonds, and the results for the GaN substrate modified in step S2 are represented by crosses. The results for the GaN substrate with the non-surface-modified irregular portion are represented by squares, and the results for the glass slide are represented by triangles. The results for the GaN substrate with the hydrophobic coating are represented by open circles.

As shown in FIG. 20, to allow 30 μL of water to slide down the GaN substrate with the non-surface-modified irregular portion, it was necessary that the sliding angle α be 40° or more. To allow 30 μL of water to slide down the GaN substrate with the hydrophobic coating, it was necessary that the sliding angle α be 70° or more. To allow 20 μL of water to slide down the glass slide, it was necessary that the sliding angle α be 60° or more. As described above, to allow 20 μL of water to slide down the GaN substrate modified in step S2, it was necessary that the sliding angle α be 45° or more, and it was not possible to allow 10 μL of water to slide down (see FIG. 16B). As can be seen from FIGS. 20 and 15A to 16B, it may be difficult to allow 10 μL or less of water to slide down the specimens 111 of the Comparative Examples.

However, the GaN substrate with the surface-modified irregular portion, which is the specimen 111 of the present Example, has the following sliding down properties. As shown in FIG. 20, in the GaN substrate with the surface-modified irregular portion, 10 μL of water dropped onto the specimen 111 was allowed to slide down at a sliding angle of 15° or more. 5 μL of water was allowed to slide down at a sliding angle of 10° or more, and 1 μL of water was allowed to slide down at a sliding angle of 50° or more. In FIG. 20, two different data curves are shown for the GaN substrate with the surface-modified irregular portion. The difference between these data curves is caused by the difference in position of water droplets dropped onto the specimen 111.

It is generally considered preferable that the specimen 111 is hydrophobic or water repellent to separate water from the specimen 111. However, as shown in FIG. 20, even with the hydrophobic specimen 111, it is difficult to allow a small volume of water, i.e., 10 μL or less of water, to slide down. It was found from the above test that, when the crystal face 12 of the specimen 111 has an irregular surface and is at least hydrophilic, water with a small volume of 10 μL or less is allowed to slide down.

Specifically, the GaN-based semiconductor device of the present Example, i.e., the GaN substrate with the surface-modified irregular portion, has the crystal face 12 inclined with respect to the c-plane, and the crystal face 12 is hydrophilic and is an irregular surface that allows 10 μL of water dropped onto the crystal face 12 to slide down when the crystal face 12 is inclined 15° or more with respect to the horizontal. When this GaN semiconductor device is used as the device 1, even a small volume of water is allowed to slide down by inclining the device 1. Therefore, water trapped by the device 1 can be efficiently collected.

The GaN-based semiconductor device is not limited to the device 1 and can also be used for, for example, building wall materials for temperature control or fins of heat exchangers.

Additional Embodiments

Embodiments 1, 2, 3, and 4 have been described as examples of the techniques disclosed in the present disclosure. However, the techniques of the present disclosure are not limited these embodiments and are applicable to embodiments in which modifications, changes, additions, omissions, etc. are made appropriately. A new embodiment can be provided by combining components described in the above embodiments 1, 2, 3, and 4.

Additional embodiments will be exemplified below.

Figure 21:
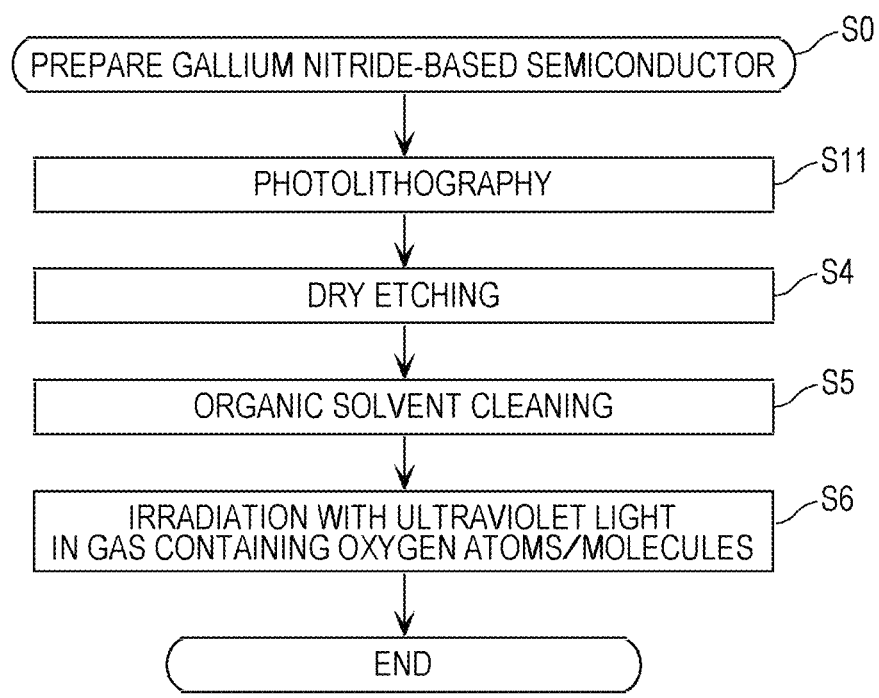
FIG. 21 is a flowchart showing an example of a device production method in an additional embodiment.

FIG. 21 is a flowchart showing an example of a device production method in an additional embodiment. In this embodiment, steps S1 to S3 are replaced with a photolithography step S11. In the photolithography step S11, the crystal face 12 of a GaN-based semiconductor 11 is modified so as to be superhydrophilic, and a resist mask is formed on the modified crystal face 12. The crystal face 12 on which the resist mask is formed is dry-etched to from an irregular portion 15 (step S4). Then the resulting crystal face 12 is subjected to organic solvent cleaning (step S5) and irradiated with ultraviolet light (step S6), and a device 1 can thereby be produced.

In embodiment 1, the organic solvent cleaning steps (steps S1 and S5) are provided before their respective ultraviolet irradiation steps (steps S2 and S6). However, these organic solvent cleaning steps are not essential steps and may be omitted. For example, surface modification is allowed to proceed by extending the ultraviolet irradiation time in step S2 or S6, increasing the concentration of activated oxygen, using ultraviolet light with a shorter wavelength, or increase the output power of the ultraviolet light.

The organic solvent cleaning step S1, the ultraviolet irradiation step S2, and the particle placing step S3 are not essential steps in the method for producing the device 1. For example, when dry etching can be used to selectively etch the crystal face 12 to form irregularities, steps S1, S2, and step S3 can be omitted.

The embodiments have been described above as examples of the techniques of the present disclosure. The accompanying drawings and the detailed description are provided for these embodiments.

Therefore, the components described in the accompanying drawings and the detailed description may include not only components essential for solving problems but also components inessential for solving the problems in order to illustrate the above techniques. Although those inessential components are described in the accompanying drawings and the detailed description, the inessential components should not be recognized as essential components because of their presence.

The above embodiments are intended to illustrate the techniques of the present disclosure, and various modifications, replacements, additions, omissions, etc. may be made within the scope of the claims or equivalents thereof.

What is claimed is:

1. A device comprising:
a semiconductor substrate that contains gallium nitride and has a crystal face inclined from 0.05° to 15° inclusive with respect to a c-plane, wherein:
the semiconductor substrate includes an irregular portion on the crystal face, and
a contact angle of pure water having a specific resistance of 18 MΩ·cm or more on a surface of the irregular portion is 10° or less.

2. The device according to claim 1,
wherein a mean width of roughness profile elements of the crystal face is from 0.8 μm to 1,000 μm inclusive.

3. The device according to claim 1,
wherein the crystal face has an arithmetic mean roughness of from 10 nm to 800 nm inclusive.

4. The device according to claim 1,
wherein the crystal face is inclined 0.4° with respect to the c-plane.

5. The device according to claim 1,
wherein the semiconductor substrate is a GaN substrate.

6. A device comprising:
a semiconductor substrate containing gallium nitride and having a crystal face inclined with respect to a c-plane, wherein:
the semiconductor substrate has an irregular portion on the crystal face,
a contact angle of pure water having a specific resistance of 18 MΩ·cm or more on a surface of the irregular portion is 10° or less, and
the surface has a characteristic that, when a pure water droplet with a volume of 10 μL is dropped onto the surface and then the surface is inclined at least 15° with respect to a horizontal plane, the water droplet slides down the surface.

7. The device according to claim 1,
wherein the pure water has a total organic carbon value of 5 ppb or less.

8. The device according to claim 6,
wherein the pure water has a total organic carbon value of 5 ppb or less.

* * * * *